United States Patent
Mikawa et al.

(10) Patent No.: US 7,807,995 B2
(45) Date of Patent: Oct. 5, 2010

(54) NONVOLATILE SEMICONDUCTOR MEMORY APPARATUS AND MANUFACTURING METHOD THEREOF

(75) Inventors: Takumi Mikawa, Shiga (JP); Takesi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 12/375,353

(22) PCT Filed: Jul. 18, 2007

(86) PCT No.: PCT/JP2007/064174

§ 371 (c)(1),
(2), (4) Date: Jan. 27, 2009

(87) PCT Pub. No.: WO2008/013086

PCT Pub. Date: Jan. 31, 2008

(65) Prior Publication Data

US 2009/0230556 A1    Sep. 17, 2009

(30) Foreign Application Priority Data

Jul. 27, 2006  (JP)  ............................. 2006-204359

(51) Int. Cl.
*H01L 29/40* (2006.01)
(52) U.S. Cl. ........................... 257/43; 257/295; 257/44; 257/4; 257/5; 257/E27.104; 257/E29.17; 257/E29.33; 257/E45.002; 365/46; 365/100; 365/148

(58) Field of Classification Search ....................... None
See application file for complete search history.

(56) References Cited

U.S. PATENT DOCUMENTS

| 2004/0085833 A1 | 5/2004 | Hwang et al. |
| 2005/0054119 A1 | 3/2005 | Hsu et al. |
| 2006/0081961 A1 | 4/2006 | Tanaka et al. |
| 2006/0099813 A1 | 5/2006 | Pan et al. |
| 2006/0197115 A1 | 9/2006 | Toda |

FOREIGN PATENT DOCUMENTS

| JP | 09-293869 | 11/1997 |
| JP | 2002-110931 | 4/2002 |
| JP | 2002-359354 | 12/2002 |
| JP | 2004-158852 | 6/2004 |

(Continued)

*Primary Examiner*—Victor A Mandala
*Assistant Examiner*—Fei Fei Yeung Lopez
(74) *Attorney, Agent, or Firm*—McDermott Will & Emery LLP

(57) ABSTRACT

A nonvolatile semiconductor memory apparatus 25 comprises a semiconductor substrate 11, a lower-layer wire 12 formed on the semiconductor substrate 11, an upper-layer wire 20 formed above the lower-layer wire 12 to cross the lower-layer wire 12, an interlayer insulating film 13 provided between the lower-layer wire 12 and the upper-layer wire 20, and a resistance variable layer 15 which is embedded in a contact hole 14 formed in the interlayer insulating film 13 and is electrically connected to the lower-layer wire 12 and the upper-layer wire 20. The upper-layer wire 20 includes at least two layers which are a lowermost layer 21 made of an electrically-conductive material having a hydrogen barrier property and an electric conductor layer 22 having a specific resistance which is lower than a specific resistance of the lowermost layer 21.

15 Claims, 15 Drawing Sheets

FOREIGN PATENT DOCUMENTS

| | | |
|---|---|---|
| JP | 2004-296732 | 10/2004 |
| JP | 2004-303996 | 10/2004 |
| JP | 2004-327658 | 11/2004 |
| JP | 2004-349689 | 12/2004 |
| JP | 2004-349961 | 12/2004 |
| JP | 2005-203733 | 7/2005 |
| JP | 2005-244235 | 9/2005 |
| JP | 2006-514440 | 4/2006 |
| JP | 2006-120707 | 5/2006 |
| JP | 2006-121044 | 5/2006 |
| JP | 2006-140464 | 6/2006 |
| JP | 2006-279042 | 10/2006 |

(a)

(b)

US 7,807,995 B2

NONVOLATILE SEMICONDUCTOR MEMORY APPARATUS AND MANUFACTURING METHOD THEREOF

RELATED APPLICATIONS

This application is the US National Phase under 35 U.S.C. §371 of International Application No. PCT/JP2007/064174 filed on Jul. 18, 2007, which claims the benefit of Japanese Application No. JP 2006-204359 filed on Jul. 27, 2006, the disclosures of which Applications are incorporated by reference herein.

TECHNICAL FIELD

The present invention relates to a nonvolatile semiconductor memory apparatus using a resistance variable layer whose resistance value reversibly varies according to an applied electric signal, and a manufacturing method thereof.

BACKGROUND ART

In recent years, with the progress of digital technologies in electronic hardware, demands for larger-capacity and nonvolatile semiconductor memory apparatuses have been increasing in order to store data of music, image, information and so on. In order to meet these demands, a nonvolatile memory apparatus using a ferroelectric capacitor and a nonvolatile semiconductor memory apparatus using a resistance variable layer (resistance variable film) whose resistance value varies according to an electric pulse and which keeps its varied state, have attracted attention.

A major part of a conventional nonvolatile memory apparatus using a ferroelectric capacitor as a memory cell is configured to include a ferroelectric capacitor having a ferroelectric film sandwiched between a lower electrode film and an upper electrode film. However, since a ferroelectric material used for such a ferroelectric capacitor is an oxide, the ferroelectric oxide is easily reduced when exposed to a reduction atmosphere, especially, hydrogen. It is known that a crystal composition is destroyed and insulation characteristics and ferroelectric characteristics are significantly degraded due to such reduction.

On the other hand, an atmosphere containing hydrogen is usually generated in steps of manufacturing semiconductor apparatuses such as LSIs. For example, annealing is performed in an atmosphere containing hydrogen to secure MOS transistor characteristics after formation of aluminum (Al) wires. Further, with miniaturization of semiconductor apparatuses, a CVD process is used for embedding tungsten (W) in contact holes having a large aspect ratio. This is carried out under a very strong reduction atmosphere containing hydrogen.

Under the circumstance, it is known that an electrically-conductive hydrogen barrier layer is formed to protect the ferroelectric capacitor from hydrogen (for example, see Patent Document 1). In the configuration shown in this document, a lower electrode, a ferroelectric film, and an upper electrode are laminated to have a layer structure on a substrate to form a ferroelectric capacitor, and an electrically-conductive hydrogen barrier film covers the upper electrode from above, or it covers the upper electrode from above and the side surfaces of the upper electrode and the ferroelectric film. A film made of titanium aluminum (TiA) alloy or TiAl alloy nitride is used as the electrically-conductive hydrogen barrier film. The TiAl based material has a feature in which it forms a structure consisting of two kinds of phases (substances). So, the TiAl based material does not substantially form a grain boundary which serves as a path for a hydrogen gas. Moreover, the TiAl based material is capable of stably absorbing a large amount of hydrogen because it is an alloy of Ti which easily absorbs a large amount of hydrogen and discharges the absorbed hydrogen at a temperature of 600° C. and Al which is covalently bonded to hydrogen. Therefore, it is possible to prevent deterioration of the ferroelectric film even under the hydrogen reduction atmosphere.

It is also proposed that penetration of a hydrogen gas into a side wall of a ferroelectric film used as a dielectric film of a ferroelectric capacitor is prevented (for example, see Patent Document 2). This memory apparatus includes a lower electrode, a ferroelectric film, and a first upper electrode which are successively laminated on a semiconductor substrate, an insulating film spacer covering the side wall of the lower electrode, and a second upper electrode covering the side wall of the insulating film spacer and the side wall of the first upper electrode. The second upper electrode is electrically insulated from the lower electrode by the insulating film spacer, while it is electrically connected to the first upper electrode. This structure can prevent hydrogen from penetrating into the ferroelectric film, thereby suppressing deterioration of the capacitor characteristics of the ferroelectric capacitor.

Further, there is proposed a memory cell array in which ferroelectric capacitors are arranged in matrix, each of the ferroelectric capacitor having a structure in which a stripe-shaped upper electrode and a stripe-shaped lower electrode are arranged to cross each other and a ferroelectric film is formed in at least a region where the upper electrode and the lower electrode cross each other, and a hydrogen barrier film is provided on the upper layers of these ferroelectric capacitors (for example, see Patent Document 3). Since active elements such as transistors are not formed in the memory cell array and the ferroelectric capacitors are arranged in matrix, the hydrogen barrier film can be formed to cover the entire region of the memory cell array, and thereby the ferroelectric capacitors can be protected from the reduction atmosphere such as a passivation film deposition step.

Patent Document 1: Japanese Laid-Open Patent Application Publication No. 2002-110931
Patent Document 2: Japanese Laid-Open Patent Application Publication No. 2002-359354
Patent Document 3: Japanese Laid-Open Patent Application Publication No. 2004-296732

DISCLOSURE OF THE INVENTION

Problems to be Solved by the Invention

In the example disclosed in Patent Document 1, the electrically-conductive hydrogen barrier film is formed on the upper surface of the upper electrode film and on the lower surface of the lower electrode. In order to prevent penetration of hydrogen into the side surfaces of these electrodes, the insulating hydrogen barrier film is formed to cover the side surfaces of the upper electrode film, the ferroelectric film, and the lower electrode film. This makes it possible to prevent deterioration of the ferroelectric capacitor due to the hydrogen gas during manufacturing, thereby achieving a high yield. Further, since the ferroelectric capacitor is not subjected to reduction due to hydrogen, it can be manufactured by the most efficient step in the semiconductor process.

In the example disclosed in Patent Document 2, the lower electrode film and the upper electrode film are the hydrogen barrier electrically-conductive films, and the side walls of these films are covered with the second upper electrode film having a hydrogen barrier property with the insulating film spacer interposed therebetween, thereby preventing reduction due to the hydrogen gas.

The examples disclosed in Patent Document 1 and Patent Document 2 merely describe the conventional ferroelectric memory structure, and a problem arises, in which the cell size is increased if the structures disclosed in these documents are applied to a cross-point type nonvolatile semiconductor memory apparatus in which resistance variable layers are provided in contact holes that are formed in an interlayer insulating layer sandwiched between a lower electrode and an upper electrode.

Further, in the example disclosed in Patent Document 3, the entire region of the memory cell array is covered with the electrically-conductive hydrogen barrier film, but the hydrogen barrier film is formed on the interlayer insulating film which is formed on the ferroelectric capacitor. Therefore, depending on the material of the interlayer insulating film, diffusion of hydrogen occurs from the peripheral area of the interlayer insulating film that is not covered with the hydrogen barrier layer, and the hydrogen reaches the ferroelectric film and reduces the same, resulting in deterioration of characteristics. This example describes not only the configuration for covering the entire area but also that the hydrogen barrier film may be disposed at every point where the upper electrode crosses each other the lower electrode. In this case, however, diffusion of hydrogen is more likely to occur from the peripheral area of the interlayer insulating film that is not covered with the hydrogen barrier layer.

As described above, the ferroelectric capacitors using the ferroelectric films are protected using the hydrogen barrier film. However, if this configuration is applied to the cross-point type nonvolatile semiconductor memory apparatus in which the resistance variable layers are provided in the contact holes formed in the interlayer insulating film, the cell size is increased, which makes it difficult to increase the memory capacity. That is, although the cross-point type nonvolatile semiconductor memory apparatus is required to be manufactured self-alignedly without increasing the cell size, it is difficult to meet such requirement with the conventional configuration. Further, although the example disclosed in Patent Document 3 describes that the hydrogen barrier film may be formed at every point where the electrodes cross each other, it is difficult to attain a sufficient hydrogen barrier characteristics because the interlayer insulating film is sandwiched between the electrodes.

In view of the above described problems, an object of the present invention is to provide a nonvolatile semiconductor memory apparatus which is capable of preventing occurrence of an event that a resistance variable layer is reduced due to a hydrogen gas generated during steps after formation of the resistance variable layer and thereby its characteristic fluctuates, without increasing a cell size thereof, and a manufacturing method thereof.

Means for Solving the Problem

To solve the above described problem, a nonvolatile semiconductor memory apparatus of the present invention comprises a semiconductor substrate; a lower-layer wire formed on the semiconductor substrate; an upper-layer wire formed above the lower-layer wire to cross the lower-layer wire; an interlayer insulating film provided between the lower-layer wire and the upper-layer wire; and a resistance variable layer which is embedded in a contact hole formed in the interlayer insulating film and is electrically connected to the lower-layer wire and to the upper-layer wire; wherein the upper-layer wire includes at least two layers which are a lowermost layer made of an electrically-conductive material having a hydrogen barrier property and an electric conductor layer having a specific resistance which is lower than a specific resistance of the lowermost layer.

A nonvolatile semiconductor memory apparatus of the present invention comprises a semiconductor substrate; and N-stage (N: integer of 2 or larger) laminated-layer units each including a lower-layer wire formed on the semiconductor substrate; an upper-layer wire formed above the lower-layer wire to cross the lower-layer wire; an interlayer insulating film provided between the lower-layer wire and the upper-layer wire; and a resistance variable layer which is embedded in a contact hole formed in the interlayer insulating film and is electrically connected to the lower-layer wire and to the upper-layer wire; wherein the upper-layer wire in the laminated-layer unit in (M−1)-th (M: integer that is not smaller than 2 and not larger than N) stage serves as the lower-layer wire in the laminated-layer unit in M-th stage; wherein the lower-layer wire and the upper-layer wire in each of the laminated-layer units cross each other and the contact hole is provided in a crossing region thereof; and wherein the upper-layer wire includes at least two layers which are a lowermost layer made of an electrically-conductive material having a hydrogen barrier property and an electric conductor layer having a specific resistance which is lower than a specific resistance of the lowermost layer.

In the nonvolatile semiconductor memory apparatus of the present invention, the lowermost layer may be provided to cover an entire of an upper surface of the resistance variable element and to extend to a region surrounding the upper surface. The lowermost layer may be provided to cover a side wall surface of the electric conductor layer.

In the nonvolatile semiconductor memory apparatus of the present invention, the lowermost layer may include at least one of Ti—Al—N, Ti—N, Ta—N, Ta—Al—N, and Ta—Si—N.

In the nonvolatile semiconductor apparatus of the present invention, the interlayer insulating film may be made of an insulating material having a hydrogen barrier property. The insulating material having the hydrogen barrier property may include silicone nitride or silicone oxide nitride.

In the nonvolatile semiconductor memory apparatus of the present invention, a side wall made of an insulating material having a hydrogen barrier property may be provided on an inner wall surface of the contact hole, and the resistance variable layer may be embedded in an inner space of the contact hole which is defined by the side wall.

In the nonvolatile semiconductor memory apparatus of the present invention, the side wall may be made of an insulating material including silicon nitride or silicon oxide nitride.

In the nonvolatile semiconductor memory apparatus of the present invention, the resistance variable layer may be made of a transition metal oxide material.

A method of manufacturing a nonvolatile semiconductor memory apparatus of the present invention, comprises a lower-layer wire forming step for forming a lower-layer wire on a semiconductor substrate; an interlayer insulating film forming step for forming an interlayer insulating film on the semiconductor substrate provided with the lower-layer wire; a contact hole forming step for forming a contact hole in a predetermined position of the interlayer insulating film on the lower-layer wire; a resistance variable layer forming step for forming a resistance variable layer connected to the lower-layer wire such that the resistance variable layer is embedded in the contact hole; and an upper-layer wire forming step for forming an upper-layer wire on the interlayer insulating film such that the upper-layer wire is connected to the resistance variable layer and crosses the lower-layer wire, the upper-layer wire including at least two layers which are a lowermost layer made of an electrically-conductive material having a hydrogen barrier property and an electric conductor layer having a specific resistance which is lower than a specific resistance of the lowermost layer.

The method of manufacturing the nonvolatile semiconductor memory apparatus may further comprise stacking a plurality of memory portions, each of the memory portions including the lower-layer wire, the resistance variable layer, and the upper-layer wire, which are arranged in a thickness direction thereof, by repeating the steps from the interlayer insulating film forming step to the upper-layer wire forming step, after the upper-layer wire forming step.

The method of manufacturing the nonvolatile semiconductor memory apparatus, may further comprise forming a side wall made of an insulating hydrogen barrier material having a hydrogen barrier property on an inner wall surface of the contact hole, after the contact hole forming step; and thereafter performing the resistance variable layer forming step to form the resistance variable layer in an inner space of the contact hole which is defined by the side wall.

The above and further objects, features and advantages of the present invention will more fully be apparent from the following detailed description of preferred embodiments with accompanying drawings.

EFFECTS OF THE INVENTION

A nonvolatile semiconductor memory apparatus and a manufacturing method thereof of the present invention provide an excellent effect of preventing occurrence of an event that a resistance variable layer is reduced due to a hydrogen gas generated during a step after formation of the resistance variable layer and thereby fluctuation in its characteristics occurs.

BRIEF DESCRIPTION OF THE DRAWINGS

FIG. 2 is a view showing major process steps for explaining a method of manufacturing the nonvolatile semiconductor memory apparatus according to Embodiment 1 of the present invention, wherein FIGS. 2(a) and 2(b) are a plan view and a cross-sectional view, respectively, showing the state where lower-layer wires are formed on a semiconductor substrate, and FIGS. 2(c) and 2(d) are a plan view and a cross-sectional view, respectively, showing the state where contact holes are formed after formation of an interlayer insulating film.

FIG. 3 is a view showing major process steps for explaining the method of manufacturing the nonvolatile semiconductor memory apparatus according to Embodiment 1 of the present invention, wherein FIGS. 3(a) and 3(b) are a plan view and a cross-sectional view, respectively showing the state where the resistance variable layers are embedded in the contact holes, and FIGS. 3(c) and 3(d) are a plan view and a cross-sectional view, respectively showing the state where upper-layer wires are formed.

FIG. 6 shows schematic cross-sectional views of major process steps for explaining a method of manufacturing the nonvolatile semiconductor memory apparatus according to Embodiment 2 of the present invention, wherein FIG. 6(a) is a cross-sectional view showing the state where the lower-layer wires are formed on the semiconductor substrate, FIG. 6(b) is a cross-sectional view showing the state where the interlayer insulating film is formed, FIG. 6(c) is a cross-sectional view showing the state where the contact holes and grooves for embedding the upper-layer wires are formed in the interlayer insulating film, FIG. 6(d) is a view showing the state where the resistance variable layers are formed in the contact holes, FIG. 6(e) is a cross-sectional view showing the state where a thin film layer which becomes the upper-layer wires is formed on the interlayer insulating film, and FIG. 6(f) is a cross-sectional view illustrating the state where the thin film layer on the interlayer insulating film is removed by CMP to form the upper-layer wires.

FIG. 11 shows schematic cross-sectional views of configurations of nonvolatile semiconductor memory apparatuses according to modifications of Embodiment 1 and Embodiment 2 of the present invention, wherein FIG. 11(a) is a cross-sectional view of a nonvolatile semiconductor memory apparatus using an insulating hydrogen barrier material for the interlayer insulating film, which has the same configuration as the nonvolatile semiconductor memory apparatus of Embodiment 1, FIG. 11(b) is a cross-sectional view of the nonvolatile semiconductor memory apparatus using the insulating hydrogen barrier material for the interlayer insulating film, which has the same configuration as the nonvolatile semiconductor memory apparatus of the modification of Embodiment 1, and FIG. 11(c) is a cross-sectional view of the nonvolatile semiconductor memory apparatus using the insulating hydrogen barrier material for the interlayer insulating film, which has the same configuration as the nonvolatile semiconductor memory apparatus of Embodiment 2.

FIG. 13 shows cross-sectional views of major process steps for explaining a method of manufacturing a major part of a memory area of the nonvolatile semiconductor memory apparatus according to Embodiment 6 of the present invention, wherein FIG. 13(a) is a cross-sectional view showing the state where the lower-layer wires are formed on the semiconductor substrate and the interlayer insulating film is formed thereon, FIG. 13(b) is a cross-sectional view showing the state where the contact holes are formed in the interlayer insulating film, FIG. 13(c) is a cross-sectional view showing the state where the side walls made of an insulating hydrogen barrier material are formed in the contact holes, FIG. 13(d) is a cross-sectional view showing the state where the resistance variable layers are embedded in the contact holes, and FIG. 13(e) is a cross-sectional view showing the state where the upper-layer wires are formed.

FIG. 15 shows cross-sectional views of major process steps for explaining a method of manufacturing the nonvolatile semiconductor memory apparatus according to Embodiment 7 of the present invention, wherein FIG. 15(a) is a cross-sectional view showing the state where a first laminated-layer unit is formed, FIG. 15(b) is a cross-sectional view showing the state before formation of upper-layer electrodes in a second laminated-layer unit, FIG. 15(c) is a cross-sectional view showing the state where the upper-layer electrodes in the second laminated-layer unit are formed, and FIG. 15(d) is a cross-sectional view showing the state where a third laminated-layer unit is formed.

FIG. 16 shows schematic cross-sectional views of configurations of nonvolatile semiconductor memory apparatus according to modifications of Embodiment 7 of the present invention, wherein FIG. 16(a) is a cross-sectional view of a nonvolatile semiconductor memory apparatus in which each lower-layer wire and each upper-layer wire have a laminated-layer structure including an electrically-conductive hydrogen barrier layer and an electric conductor layer having a specific resistance lower than that of the electrically-conductive hydrogen barrier layer, FIG. 16(b) is a cross-sectional view of the nonvolatile semiconductor memory apparatus in which portions of upper-layer wires are embedded in contact holes, and the entire upper-layer wires are embedded in the grooves formed in the interlayer insulating film, and FIG. 16(c) is a cross-sectional view of a nonvolatile semiconductor memory apparatus in which the side walls made of an insulating hydrogen barrier material having a hydrogen barrier property are formed on the inner walls of the contact holes.

Figure 1:
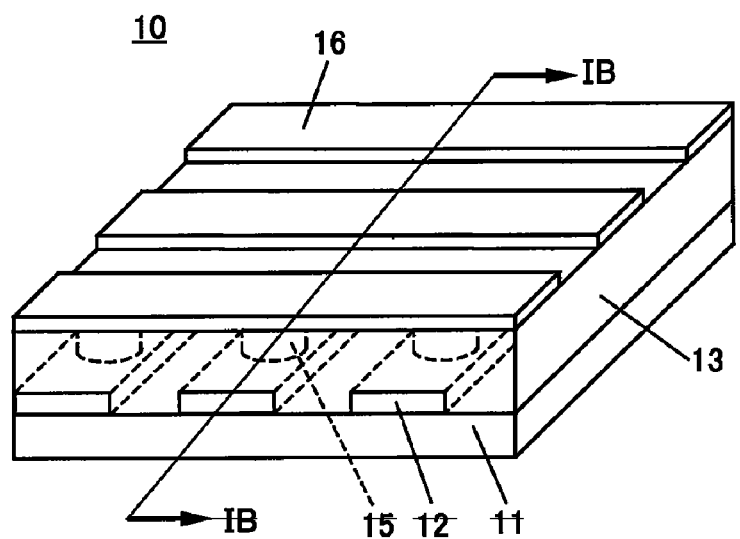
FIG. 1(a) is a perspective view schematically showing a major part of a nonvolatile semiconductor memory apparatus according to Embodiment 1 of the present invention.
FIG. 1(b) is a cross-sectional view taken along a line IB-IB in FIG. 1(a).
Figure 1:
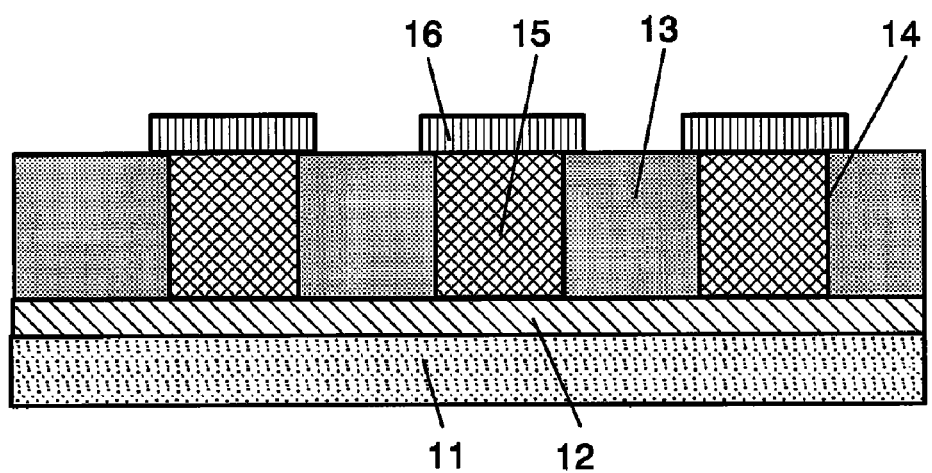

EXPLANATION OF REFERENCE NUMERALS 10,10a,25,25a,30,30a,35,40,45,50,55,60,70,80 . . . nonvolatile semiconductor memory apparatus (ReRAM)
11 . . . semiconductor substrate
12,17,121,171 . . . lower-layer wire
13,13a,131,132,133 . . . interlayer insulating film
14 . . . contact hole
15,151,152,153 . . . resistance variable layer
16,20,163,203,204 . . . upper-layer wire
18,21,181,211,213,221,223,231,233 . . . electrically-conductive hydrogen barrier layer
19,22,191,212,222,232 . . . electric conductor layer
23 . . . side wall
24 . . . groove
26 . . . thin film layer
27 . . . first thin film layer
28 . . . second thin film layer
41 . . . connection wire
42,44,45 . . . embedded electric conductor
43 . . . connection electrode
161,162,201,202 . . . upper-layer wire (lower-layer wire)

BEST MODE FOR CARRYING OUT THE INVENTION

Hereinafter, embodiments of the present invention will be described with reference to the drawings. It should be noted that the same reference numerals are used to identify the same components or constituents, and description thereof is in some cases omitted. Further, in the drawings to be used for explaining the following embodiments, only major parts of memory areas of nonvolatile semiconductor memory apparatuses are schematically shown, and the configurations thereof are partially enlarged for easier illustration.

Embodiment 1

FIG. 1 is a schematic view for explaining a major part of a nonvolatile semiconductor memory apparatus 10 according to Embodiment 1 of the present invention, wherein FIG. 1(a) is a perspective view thereof, and FIG. 1(b) is a cross-sectional view taken in the direction of the arrows along a line IB-IB in FIG. 1(a). In FIG. 1, only a major part of a memory area of the nonvolatile semiconductor memory apparatus 10 is schematically shown.

The nonvolatile semiconductor memory apparatus 10 of this embodiment includes a semiconductor substrate 11, lower-layer wires 12 formed on the semiconductor substrate 11, an interlayer insulating film 13 formed on the semiconductor substrate 11 so as to cover the lower-layer wires 12, resistance variable layers 15 which are embedded in contact holes 14 formed in the interlayer insulating film 13 on the lower-layer wires 12 and are connected to the lower-layer wires 12, and upper-layer wires 16 which are formed on the interlayer insulating film 13 so as to be connected to the resistance variable layers 15 and so as to cross the lower-layer wires 11. That is, the nonvolatile semiconductor memory apparatus 10 of this embodiment is a cross-point type memory apparatus having a memory area of an array structure in which memory portions including the resistance variable layers 15 are arranged in matrix.

Each memory portion is composed of the resistance variable layer 15 and the lower-layer wire 12 and the upper-layer wire 16 sandwiching the resistance variable layer 15, and at least the surfaces of the lower-layer wire 12 and the upper-layer wire 16, which contact the resistance variable layer 15, are made of an electrically-conductive material having a hydrogen barrier property. As shown in FIG. 1, the lower-layer wire 12 and the upper-layer wire 16 completely cover the lower and upper surfaces of the resistance variable layer 15, respectively, and extend to regions surrounding these surfaces. Furthermore, in this embodiment, the lower-layer wire 12 and the upper-layer wire 16 are made of an electrically-conductive hydrogen barrier material. As the electrically-conductive hydrogen barrier material, a material including at least one of Ti—Al—N, Ti—N, Ta—N, Ta—Al—N, and Ta—Si—N may be used.

Since the upper-layer wire 16 completely covers the upper surface of the resistance variable layer 15 as described above, the resistance variable layer 15 is not damaged by plasma, and thereby occurrence of fluctuation in the characteristics of the resistance variable layer 15 can be prevented, even when dry-etching using the plasma is performed during processing of the upper-layer wire 16. Further, since the upper-layer wire 16 is formed to extend to a region surrounding the upper surface of the resistance variable layer 15, occurrence of fluctuation in the characteristics of the resistance variable layer 15 can be prevented, even if mask misalignment in lithography occurs.

As shown in FIG. 1, in the nonvolatile semiconductor memory apparatus 10 of this embodiment, the lower-layer wires 12 as word lines for row selection are provided on the semiconductor substrate 11 made of, for example, silicon. The lower-layer wires 12 are stripe-shaped, and are provided in plural number at predetermined pitches. The interlayer insulating film 13 made of silicon oxide or TEOS—SiO$_2$ is formed on the semiconductor substrate 11 and the lower-layer wires 12. The contact holes 14 are formed at predetermined positions in the interlayer insulating film 13 on the lower-layer wires 12, i.e., in the areas where the upper-layer wires 16 which will be formed later cross the lower-layer wires 12, and the resistance variable layers 15 are embedded in the contact holes 14. When an electric pulse is applied to the lower-layer wires 12 and to the upper-layer wires 16, the resistance values of the resistance variable layers 15 significantly vary, and the resistance variable layers 15 keep this resistance-varied state. Thereby, binary states, i.e., the state having a large resistance value and the state having a small resistance value, are obtained, and the resistance variable layers 15 can be used to function as memories. As a material having such characteristics, for example, a transition metal oxide may be used. As an example of the transition metal oxide, an iron oxide thin film such as triiron tetroxide may be used. Since these materials are oxides, the resistance varying characteristics thereof are deteriorated if they are reduced by a hydrogen gas, causing these materials to have inadequate memory functions.

The upper-layer wires 16 are, for example, bit lines, which are arranged to cross the lower-layer wires 12, and are electrically connected to the resistance variable layers 15 embedded in the contact holes 14. The lower-layer wires 12 and the upper-layer wires 16 are respectively connected to a semiconductor circuit (not shown). Thus, a cross-point type ReRAM 10 is attained, in which the lower-layer wires 12 and the upper-layer wires 16 are formed of the electrically-conductive hydrogen barrier material, and these wires completely cover the resistance variable layers 15.

As described above, since the lower-layer wires 12 and the upper-layer wires 16 are provided on and under respective of the resistance variable layers 15 such that each wire is made of a hydrogen barrier material and each wire is formed to have a larger width than the resistance variable layer 15, it is possible to prevent occurrence of an event that the resistance variable layers 15 are reduced and its memory characteristic is deteriorated due to diffusion of the hydrogen gas generated in various steps to be performed after formation of the memory portions, such as an interlayer insulating film formation step or a protective film formation step. Therefore, it is possible to attain a nonvolatile semiconductor memory apparatus 10 having stable and highly-reproducible resistance variable layers 15, by using the conventional semiconductor process.

While in this embodiment the resistance variable layers 15 physically contact the lower-layer wires 12 and the upper-layer wires 16, they may be electrically connected to the lower-layer wires 12 and/or the upper-layer wires 16, instead of physical contact. Also in this configuration, the same effect of preventing diffusion of hydrogen can be obtained.

Figure 2:
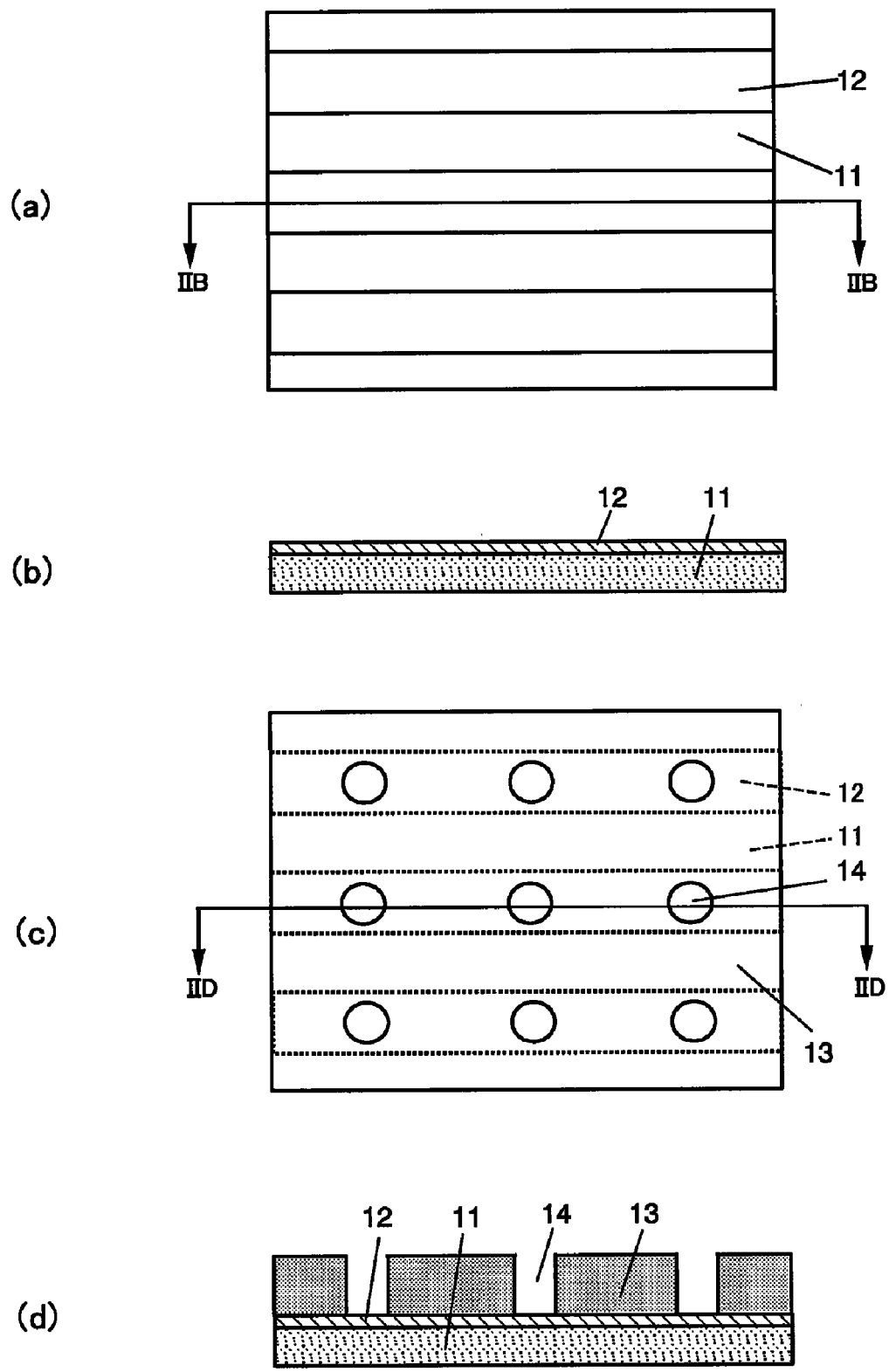
Figure 3:
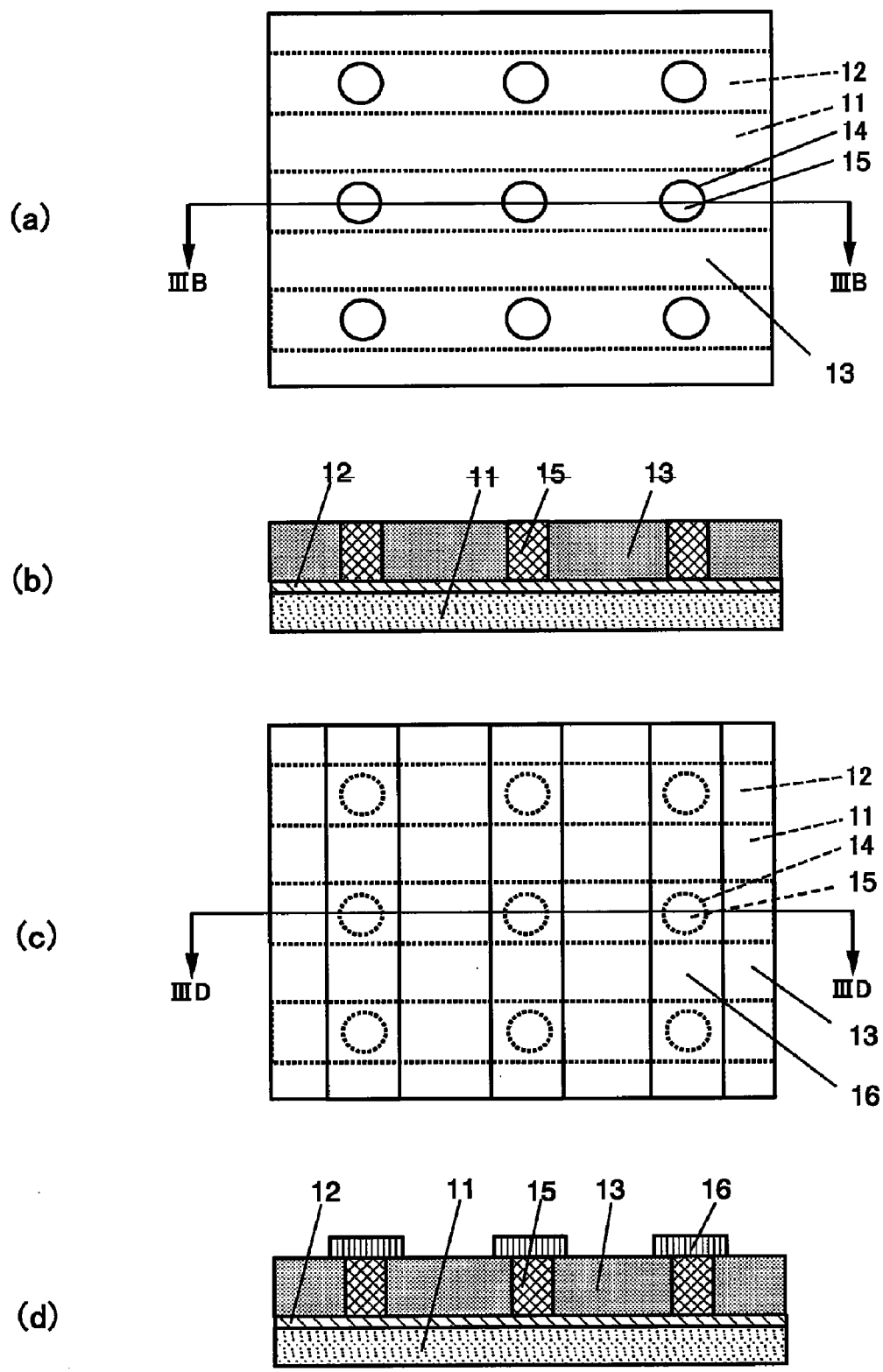

Next, a method of manufacturing the nonvolatile semiconductor memory apparatus 10 according to this embodiment will be described with reference to FIGS. 2 and 3. FIGS. 2 and 3 are views illustrating major process steps for explaining the method of manufacturing the nonvolatile semiconductor memory apparatus of this embodiment. FIG. 2(a) is a plan view showing the state where the lower-layer wires 12 are formed on the semiconductor substrate 11, FIG. 2(b) is a cross-sectional view taken in the direction of the arrows along a IIB-IIB line in FIG. 2(a), FIG. 2(c) is a plan view showing the state where the contact holes 14 are formed after formation of the inter-layer insulating film 13, and FIG. 2(d) is a cross-sectional view taken in the direction of arrows along a IID-IID line in FIG. 2(c). FIG. 3(a) is a plan view showing the state where the resistance variable layers 15 are embedded in the contact holes 14, FIG. 3(b) is a cross-sectional view taken in the direction of arrows along a IIIB-IIIB line in FIG. 3(a), FIG. 3(c) is a plan view showing the state where the upper-layer wires 16 are formed, and FIG. 3(d) is a cross-sectional view taken in the directions of arrows along a IIID-IIID line in FIG. 3(c).

Initially, as shown in FIGS. 2(a) and 2(b), a plurality of stripe-shaped lower-layer wires 12 as word lines for row selection are formed to extend in parallel with each other on the semiconductor substrate 11 on which various electric conductor patterns (not shown) and semiconductor integrated circuits (not shown) are formed. For example, the lower-layer wires 12 can be formed by depositing Ti—Al—N by a sputtering process, and performing an exposure process and an etching process.

Next, as shown in FIGS. 2(c) and 2(d), the interlayer insulating film 13 made of TEOS—SiO$_2$ is deposited by, for example, a CVD process on the semiconductor substrate 11 provided with the lower-layer wires 12. The interlayer insulating film 13 is not limited to the above one, but an interlayer insulating film material used in ordinary semiconductor process may be used. Thereafter, a plurality of contact holes 14 are formed at constant arrangement pitches in the interlayer insulating film 13 on the lower-layer wires 12. As can be seen from FIG. 2(c), each contact hole 14 has a diameter smaller than a width of the lower-layer wire 12. Whereas in FIG. 2(c) the contact hole 14 is circular in shape, the shape of the contact hole 14 is not limited to circular, but may be rectangle, oval, or other shapes.

Next, as shown in FIGS. 3(a) and 3(b), the resistance variable layers 15 are embedded in the contact holes 14. This step can be performed by using a damocene process which includes depositing a thin film, which becomes the resistance variable layers 15, over the entire surface, and performing chemical mechanical polishing (CMP) to flatten the surface.

Next, as shown in FIGS. 3(c) and 3(d), a plurality of stripe-shaped upper-layer wires 16 to be connected to the resistance variable layers 15 are formed so as to extend in parallel with each other and so as to cross the lower-layer wires 12. The upper-layer wires 16 serve as bit lines for column selection. Like the lower-layer wires 12, the upper-layer wires 16 are formed of an electrically-conductive hydrogen barrier material, and are each formed to have a larger width than the resistance variable layer 15.

Through the aforementioned steps, the major part of the nonvolatile semiconductor memory apparatus 10 of this embodiment can be manufactured. Furthermore, the lower-layer wires 12 and the upper-layer wires 16 are connected to the semiconductor circuits (not shown), and desired interlayer insulating films, protective films, and the like are formed, thus manufacturing the cross-point type nonvolatile semiconductor memory apparatus 10.

As described above, a transition metal oxide material may be used for the resistance variable layers 15. To be specific, the resistance variable layers 5 may be formed using a transition metal oxide such as triiron tetroxide, titanic oxide, vanadium oxide, cobalt oxide, nickel oxide, zinc oxide, copper oxide, or niobe film oxide by the sputtering process or the like. Such transition metal oxide material shows a specific resistance value when a voltage or a current which is higher than a threshold value is applied thereto, and maintains the resistance value until a pulse voltage or a pulse current with a specified magnitude is newly applied thereto.

A metal oxide material may be used for the interlayer insulating film. To be specific, a silicone oxide ($SiO_2$) formed by the CVD process, or a TEOS—$SiO_2$ film formed using $O_3$ (ozone) and TEOS (tetraethoxysilane) by the CVD process under a non-reduction condition, may be used.

Figure 4:
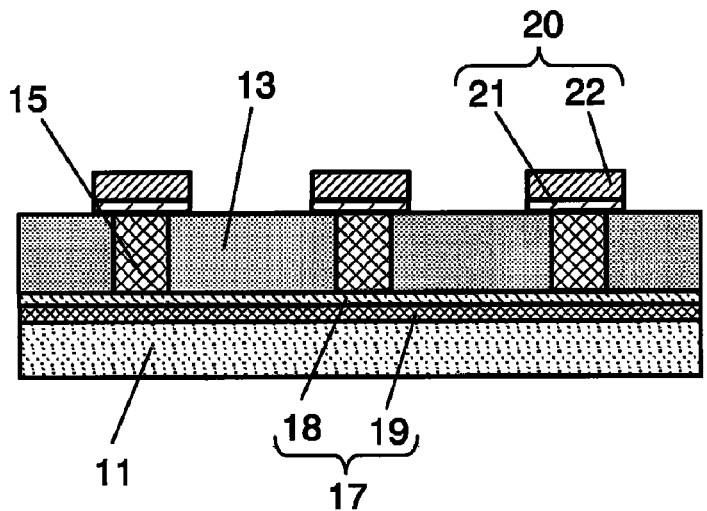
FIG. 4 is a schematic cross-sectional view illustrating a major part of a nonvolatile semiconductor memory apparatus according to a modification of Embodiment 1 of the present invention.

FIG. 4 is a schematic cross-sectional view illustrating a major part of a nonvolatile semiconductor memory apparatus 25 according to a modification of this embodiment. The nonvolatile semiconductor memory apparatus 25 shown in FIG. 4 is different from the nonvolatile semiconductor memory apparatus 10 shown in FIG. 1 in that each of a lower-layer wire 17 and an upper-layer wire 20 has a double-layer structure in such a way that the lower-layer wire 17 includes an electrically-conductive hydrogen barrier layer 18 and an electric conductor layer 19 having a specific resistance lower than that of the electrically-conductive hydrogen barrier layer 18 and the upper-layer wire 20 includes an electrically-conductive hydrogen barrier layer 21 and an electric conductor layer 22 having a specific resistance lower than that of the electrically-conductive hydrogen barrier layer 21. Both of the lower-layer wire 17 and the upper-layer wire 20 have a structure in which the electrically-conductive hydrogen barrier layers 18 and 21 are located on the side contacting the resistance variable layer 15. In other words, the lower-layer wire 17 is formed by laminating the electric conductor layer 19 and the electrically-conductive hydrogen barrier layer 18 in this order while the upper-layer wire 20 is formed by laminating the electrically-conductive hydrogen barrier layer 21 and the electric conductor layer 22 in this order, and the resistance variable layer 15 is sandwiched between the electrically-conductive hydrogen barrier layers 18 and 21. Since the lower-layer wire 17 and the upper-layer wire 20 have such a structure, a resistance can be reduced as a whole by using the electric conductor layers 19 and 22 made of, for example, copper (Cu) and having a specific resistance lower than that of the electrically-conductive hydrogen barrier layers 18 and 21, while preventing diffusion of the hydrogen gas by the electrically-conductive hydrogen barrier layers 18 and 21. Thus, delay of a pulse signal and the like can be effectively suppressed, making it possible to attain the stable and high-performance nonvolatile semiconductor memory apparatus 25.

Further, the electrically-conductive hydrogen barrier layers 18 and 21 have a feature that they have dense membranes, which makes penetration of hydrogen difficult. Because of this, regarding the film thickness of the barrier layers 18 and 21, the film thickness for attaining the state in which the barrier layers 18 and 21 are formed uniformly and surely within a wafer surface is sufficient. On the other hand, since the electric conductor layers 19 and 22 whose specific resistance is lower than that of the electrically-conductive hydrogen barrier layers 18 and 21 contribute to a reduction in the resistance of the wires, these electric conductor layers are desired to be thick within an allowable range of the semiconductor process. In view of the above, the film thicknesses of the electrically-conductive hydrogen barrier layers 18 and 21 are preferably 5 to 20 nm, and the percentages of the electrically-conductive hydrogen barrier layers 18 and 21 in the lower-layer wire 17 and the upper-layer wire 20 are preferably 20% or less.

Whereas in the above description the electrically-conductive hydrogen barrier layers 18 and 21 and the electric conductor layers 19 and 22 in both the lower-layer wire 17 and the upper-layer wire 20 have the same shape (i.e., stripe), the electrically-conductive hydrogen barrier layers 18 and 21 may be partially formed only in regions covering the resistance variable layers 15.

Since the nonvolatile semiconductor memory apparatus 25 according to Modification 1 can be attained by replacing the lower-layer wires 12 and the upper-layer wires 16 in the nonvolatile semiconductor memory apparatus 10 of Embodiment 1 with the lower-layer wires 17 and the upper-layer wires 20 each having the laminated-layer structure, description of the manufacturing method thereof will be omitted.

As described above, according to the nonvolatile semiconductor memory apparatus of this embodiment and the manufacturing method thereof, since the resistance variable layers embedded in the contact holes are covered with the upper-layer wires having a hydrogen barrier property, it is possible to prevent occurrence of an event that the resistance variable layers are reduced by a hydrogen gas which is generated during the step after formation of the resistance variable layers and thereby their characteristic fluctuates, thus attaining a nonvolatile semiconductor memory apparatus having stable characteristics by using the conventional semiconductor process.

Further, since each upper-layer wire has the laminated-layer structure of at least two layers including the lowermost layer made of the electrically-conductive material having a hydrogen barrier property and the electric conductor layer having a specific resistance lower than that of the lowermost layer, a resistance can be reduced for the entire upper-layer wire, and as a result, wire delay and deterioration of signals due to parasitic wire resistance can be suppressed.

Note that the above described effects achieved in this embodiment are similarly attained in Embodiments 2 to 7 to be described hereinafter.

Embodiment 2

Figure 5:
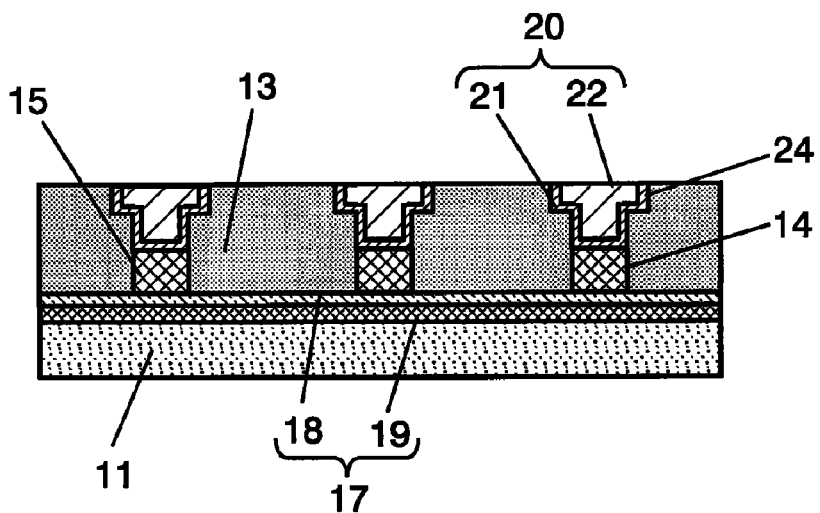
FIG. 5 is a schematic cross-sectional view illustrating a configuration of a nonvolatile semiconductor memory apparatus according to Embodiment 2 of the present invention.

FIG. 5 is a schematic cross-sectional view illustrating a configuration of a nonvolatile semiconductor memory apparatus 30 according to Embodiment 2 of the present invention. The nonvolatile semiconductor memory apparatus 30 of this embodiment is different from the nonvolatile semiconductor memory apparatus 10 of Embodiment 1 in that the lower-layer wire 17 includes the electrically-conductive hydrogen barrier layer 18 and the electric conductor layer 19 having a specific resistance lower than that of the electrically-conductive hydrogen barrier layer 18 and the upper-layer wire 20 includes the electrically-conductive hydrogen barrier layer 21 and the electric conductor layer 22 having a specific resistance lower than that of the electrically-conductive hydrogen barrier layer 21, portions of the upper-layer wires 20 are embedded in the contact holes 14 and the upper-layer wires 20 are entirely embedded in the grooves 24 formed in the interlayer insulating film 13. In such a configuration, the upper-layer wires 20 can be formed self-alignedly by forming the resistance variable layers 14 and the upper-layer wires 20 after formation of the contact holes 14 and the grooves 24 for embedding the upper-layer wires 20, and therefore, the shapes of the memory portions and the like can be easily miniaturized. As the result, a nonvolatile semiconductor memory apparatus 30 having large-capacity memory portions can be manufactured at reduced cost.

A resistance can be reduced as a whole by the electric conductor layers 19 and 22, and thereby delay of the pulse signal or the like can be effectively suppressed. As the result, the stable and high-performance nonvolatile semiconductor memory apparatus 30 can be attained.

Figure 6:
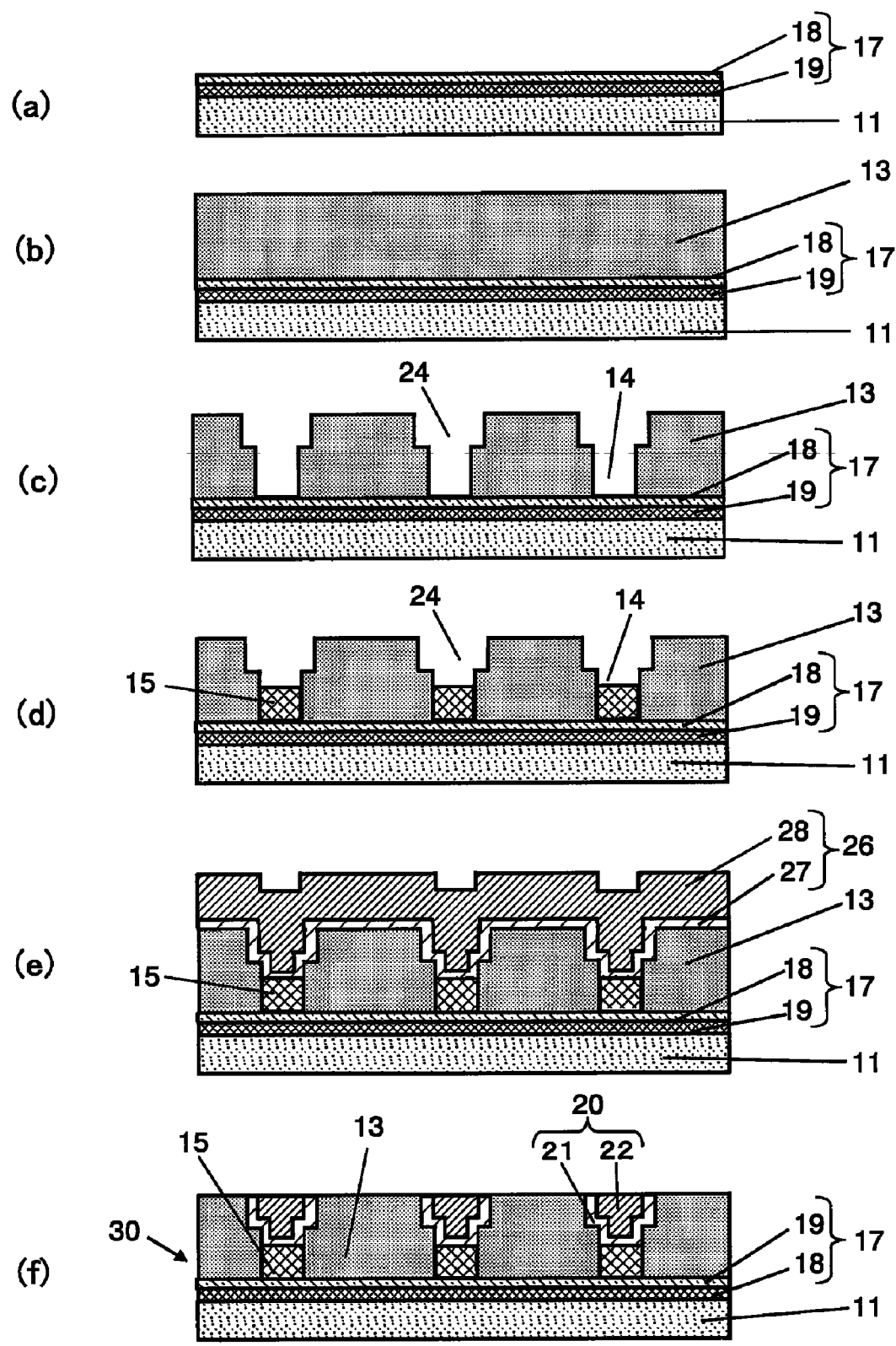

FIG. 6 shows schematic cross-sectional views of major process steps for explaining the method of manufacturing the nonvolatile semiconductor memory apparatus 30 of this embodiment, wherein FIG. 6(a) is a cross-sectional view showing the state where the lower-layer wires 17 are formed on the semiconductor substrate 11, FIG. 6(b) is a cross-sectional view showing the state where the interlayer insulating film 13 is further formed, FIG. 6(c) is a cross-sectional view showing the state where the contact holes 14 and the grooves 24 for embedding the upper-layer wires 20 are formed in the interlayer insulating film 13, FIG. 6(d) is a view showing the state where the resistance variable layers 14 are formed in the contact holes 14, FIG. 6(e) is a cross-sectional view showing the state where a thin film layer 26 which becomes the upper-layer wires 20 is formed on the interlayer insulating film 13, and FIG. 6(f) is a cross-sectional view illustrating the state where the thin film layer 26 on the interlayer insulating film 13 is partially removed by CMP to form the upper-layer wires 20.

Initially, as shown in FIG. 6(a), the electrically-conductive hydrogen barrier layer 18 made of an electrically-conductive material such as Ti—Al—N and the electric conductor layer 19 made of copper are deposited to be laminated on the semiconductor substrate 11, and these layers are shaped into a predetermined pattern by an exposure process and an etching process, thereby forming the lower-layer wires 17 as word lines for row selection.

Next, as shown in FIG. 6(b), the interlayer insulating film 13 is formed. Since the interlayer insulating film 13 can be formed using the same material and method as those described for the nonvolatile semiconductor memory apparatus 10 of Embodiment 1, detailed description will be omitted. The thickness of this interlayer insulating film 13 is set to a sum of the thickness required for embedding the resistance variable layer 15 and a portion of the upper-layer wire 20, and the thickness of the groove 24 for forming the upper-layer wire 20.

Next, as shown in FIG. 6(c), the grooves 24 in which the upper-layer wires 20 are to be formed are formed so as to cross the lower-layer wires 17. This can be easily performed using an exposure process and an etching process. Thereafter, the contact holes 14 are formed at predetermined positions in the interlayer insulating film 13 on the lower-layer wires 17, that is, in the crossing regions where the upper-layer wires 20 to be formed later cross the lower-layer wires 17. This can be easily performed using an exposure process and an etching process. The grooves 24 and the contact holes 14 are not necessarily formed in the above-mentioned order. The grooves 24 may be formed after formation of the contact holes 14 by an exposure process and an etching process.

Next, as shown in FIG. 6(d), the resistance variable layers 15 are embedded in the contact holes 14. For example, this step is carried out as follows. Initially, in the state where the contact holes 14 and the grooves 24 are formed as shown in FIG. 6(c), a thin film which becomes the resistance variable layers 15 is formed over the entire surface. The formation of this thin film which becomes the resistance variable layers 15 can be performed in the same process using the same material as those described in Embodiment 1. At this time, the film thickness of the thin film which becomes the resistance variable layers 15 is set so that the contact holes 14 are filled up with the thin film. Thereafter, the entire surface is etched so as to leave the resistance variable layers 15 only in the contact holes 14.

Thereby, the configuration in which the resistance variable layers 15 are embedded in the contact holes 14 as shown in FIG. 6(d) can be obtained. For the purpose of steady etching, this etching process is desirably carried out in such a manner that the resistance variable layers 15 are etched so as to be embedded up to a height that is not equal to that of the contact holes 14 but slightly lower than that of the contact holes 14 so that the resistance variable layers 15 are surely embedded in the contact holes 14. Further, this etching is desirably isotropic etching to surely remove the thin film adhering to the side walls of the grooves 24 or the like. This isotropic etching may be dry etching or wet etching.

After the resistance variable layers 15 are embedded up to a predetermined depth in the contact holes 14 as shown in FIG. 6(d), the thin film layer 26 which becomes the upper-layer wires 20 is formed as shown in FIG. 6(e). In this case, the thin film layer 26 has a laminated-layer structure which is obtained by forming a first thin film layer 27 made of an electrically-conductive hydrogen barrier material on the resistance variable layers 15 side and then forming a second thin film layer 28 made of a material having a relatively low specific resistance such as copper on the first thin film layer 27.

Next, as shown in FIG. 6(f), the thin film layer 26 on the interlayer insulating film 13 is polished and removed by the CMP, thereby forming a memory area having a shape in which the resistance variable layers 15 are embedded up to a predetermined depth in the contact holes 14, portions of the upper-layer wires 20 are also embedded in the contact holes 14, and the upper-layer wires 20 are entirely embedded in the grooves 24 formed in the interlayer insulating film 13.

In the nonvolatile semiconductor memory apparatus 30 of this embodiment, the electrically-conductive hydrogen barrier layers 21 are provided so as to also cover the side wall surfaces of the electric conductor layers 22. Therefore, the hydrogen gas generated due to diffusion or the like from the electric conductor layer 22 can be effectively blocked.

The manufacturing step for the nonvolatile semiconductor memory apparatus 30 of this embodiment is not limited to that mentioned above. For example, the resistance variable layers 15 shown in FIG. 6(d) may be formed by the following method. To be specific, after the contact holes 14 are opened, the resistance variable layers 15 may be embedded in the contact holes 14 by electroless plating using, as a mask, a photoresist film formed for the openings. Also in this case, the resistance variable layers 15 are desirably embedded up to a height that is slightly lower than the height of the contact holes 14. It should be noted that in this forming method, the resistance variable layers 15 must be formed of a material which is capable of being plated.

Figure 11:
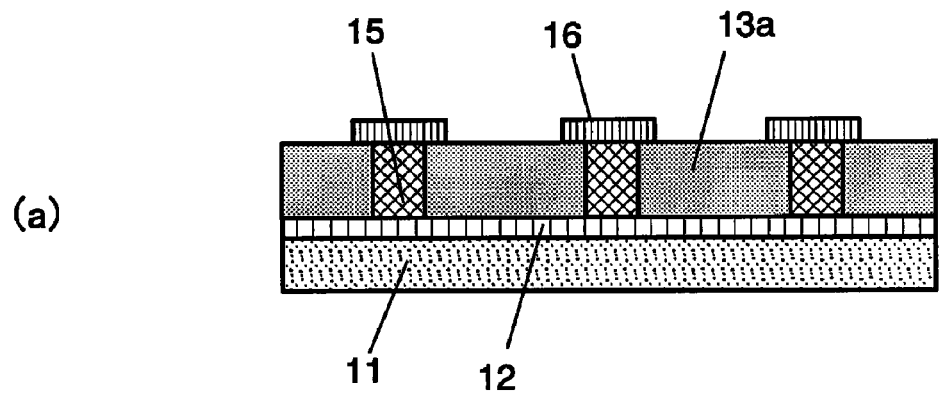
Figure 11:
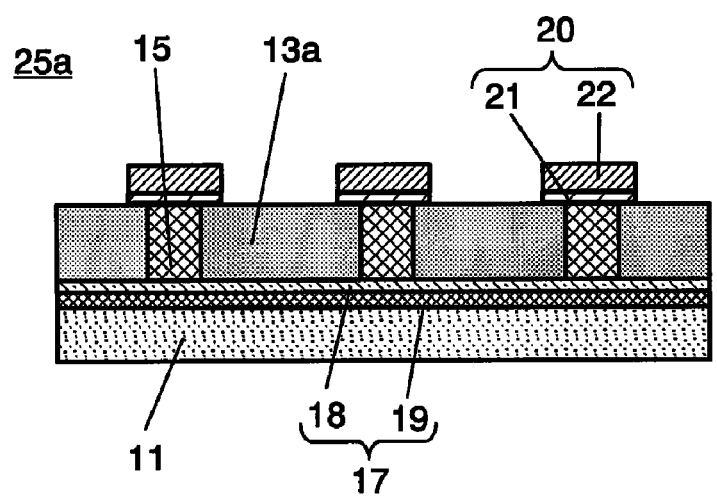
Figure 11:
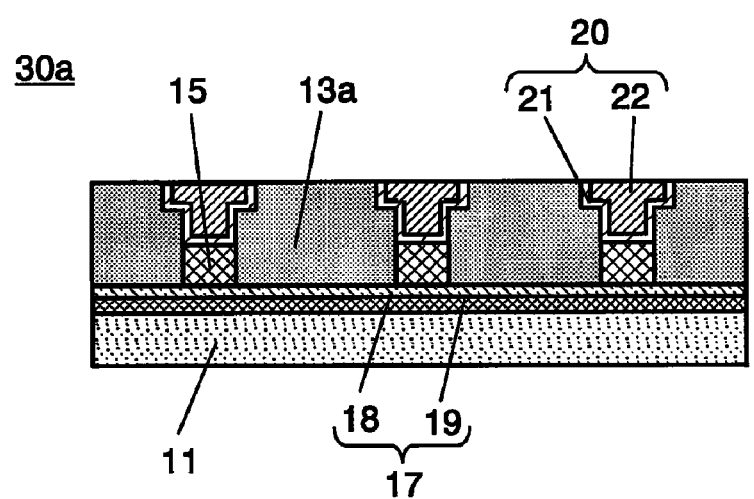

Whereas in Embodiment 1 and Embodiment 2 an oxide insulating material such as the TEOS—$SiO_2$ film or the silicon oxide film is used as the interlayer insulating film 13, the present invention is not limited thereto. As shown in FIG. 11, an interlayer insulating film 13a made of an insulating hydrogen barrier material may be used. FIG. 11 shows schematic cross-sectional views of configurations of nonvolatile semiconductor memory apparatuses according to modifications of Embodiment 1 and Embodiment 2, wherein FIG. 11(*a*) is a cross-sectional view of a nonvolatile semiconductor memory apparatus 10a using an insulating hydrogen barrier material as an interlayer insulating film 13a, which has the same configuration as the nonvolatile semiconductor memory apparatus 10 of Embodiment 1, FIG. 11(*b*) is a cross-sectional view of a nonvolatile semiconductor memory apparatus 25a using an insulating hydrogen barrier material for the interlayer insulating film 13a, which has the same configuration as the nonvolatile semiconductor memory apparatus 25 of the modification of Embodiment 1, and FIG. 11(*c*) is a cross-sectional view of a nonvolatile semiconductor memory apparatus 30a using an insulating hydrogen barrier material for the interlayer insulating film 13a, which has the same configuration as the nonvolatile semiconductor memory apparatus 30 of Embodiment 2. Silicon nitride or silicon oxide nitride may be used as the insulating hydrogen barrier material. This configuration can effectively suppress occurrence of an event that the hydrogen penetrates into the resistance variable layer 15 due to diffusion or the like.

Embodiment 3

Figure 7:
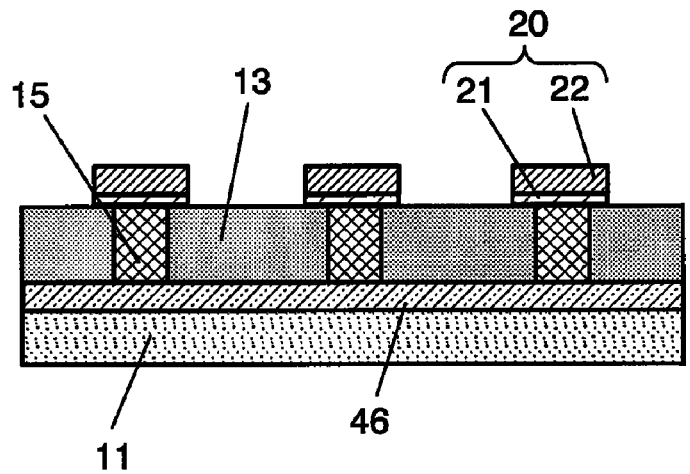
FIG. 7 is a schematic cross-sectional view illustrating a configuration of a nonvolatile semiconductor memory apparatus according to Embodiment 3 of the present invention.

FIG. 7 is a schematic cross-sectional view illustrating a configuration of a nonvolatile semiconductor memory apparatus 35 according to Embodiment 3 of the present invention. The nonvolatile semiconductor memory apparatus 35 shown in FIG. 7 is different from the nonvolatile semiconductor memory apparatus 10 shown in FIG. 1 in that only the upper-layer wire 20 has a double-layer structure including the electrically-conductive hydrogen barrier layer 21 and the electric conductor layer 22 having a specific resistance lower than that of the electrically-conductive hydrogen barrier layer 21. The electrically-conductive hydrogen barrier layer 21 is located on the side contacting the resistance variable layer 15. A lower-layer wire 46 is an ordinary wire including no electrically-conductive hydrogen barrier layer. In the upper-layer wire 20 having such a configuration, a resistance can be reduced as a whole by using the electric conductor layer 22 made of, for example, copper (Cu) having a specific resistance lower than that of the electrically-conductive hydrogen barrier layer 21. Thereby, delay in the pulse signal, and the like can be effectively suppressed, attaining the stable and high-performance nonvolatile semiconductor memory apparatus 35. Even when the electrically-conductive hydrogen barrier is disposed at only the upper side, it is possible to prevent fluctuation in characteristics such as a reduction in the initial resistance of the resistance variable layer and non-uniformity of the elements, since hydrogen is mostly likely to be diffused from the upper side during the semiconductor process. Especially when the resistance variable layer has some high resistance, providing the electrically-conductive hydrogen barrier layer only in the upper-layer wire will suffice. As compared with the case where the electrically-conductive barriers are formed in both of the upper and lower-layer wires, the configuration having the electrically-conductive hydrogen barrier layer only in the upper-layer wire can simplify the semiconductor process, leading to a reduced process cost.

Whereas in the above-description the electrically-conductive hydrogen barrier layer 21 and the electric conductor layer 22 in the upper-layer wire have the same shape, the electrically-conductive hydrogen barrier layer 21 may be partially formed on only a region covering the resistance variable layer 15. Since the nonvolatile semiconductor memory apparatus 35 of this embodiment can be obtained by replacing the upper-layer wires 16 in the nonvolatile semiconductor memory apparatus 10 of Embodiment 1 with the upper-layer wires 20 having the laminated-layer structure, description of the manufacturing method of the nonvolatile semiconductor memory apparatus 35 will be omitted.

Embodiment 4

Figure 8:
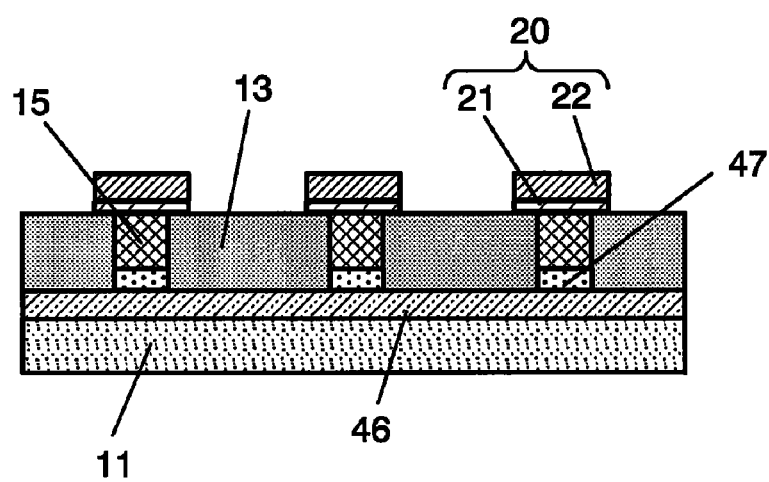
FIG. 8 is a schematic cross-sectional view illustrating a configuration of a nonvolatile semiconductor memory apparatus according to Embodiment 4 of the present invention.

FIG. 8 is a schematic cross-sectional view illustrating a configuration of a nonvolatile semiconductor memory apparatus 40 according to Embodiment 4 of the present invention. The nonvolatile semiconductor memory apparatus 40 shown in FIG. 8 is different from the nonvolatile semiconductor memory apparatus 35 of Embodiment 3 shown in FIG. 7 in that a diode element 47 having a rectifying characteristic is formed in each contact hole, in addition to the resistance variable layer 15. For example, the diode element 47 is preferably a schottky diode having a metal/semiconductor structure, an MSM (MIM) diode having a metal/semiconductor (insulator)/metal structure, or a PN diode having a junction of a P-type semiconductor and a N-type semiconductor. With such a configuration, in addition to the effect of preventing diffusion of hydrogen gas by the electrically-conductive hydrogen barrier layer 21, the diode element serves as a selector switch in the state where it is connected to a resistor element in series so that a leakage current to adjacent elements can be suppressed. Thus, a large-capacity cross-point memory is attainable.

Whereas in this embodiment the diode element 47 formed in each contact hole is positioned between the resistance variable layer 15 and the lower-layer wire 46, it may be positioned between the resistance variable layer 15 and the upper-layer wire 20.

Embodiment 5

Figure 9:
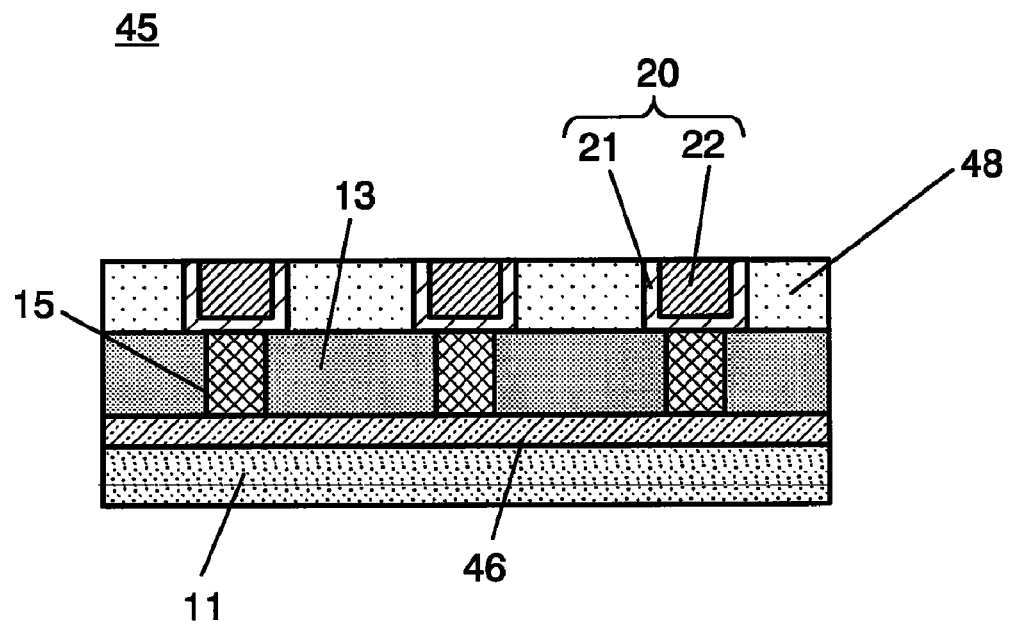
FIG. 9 is a schematic cross-sectional view illustrating a configuration of a nonvolatile semiconductor memory apparatus according to Embodiment 5 of the present invention.

FIG. 9 is a schematic cross-sectional view illustrating a configuration of a nonvolatile semiconductor memory apparatus 45 according to Embodiment 5 of the present invention. The nonvolatile semiconductor memory apparatus 45 shown in FIG. 9 is different from the nonvolatile semiconductor memory apparatus 35 of Embodiment 3 shown in FIG. 7 in that the electrically-conductive hydrogen barrier layer 21 of each upper-layer wire 20 is formed not only on the bottom surface but also on the side surface of the upper-layer wire. Since the hydrogen barrier layer exists in a region between the upper-layer wire and the interlayer insulating film where hydrogen relatively easily diffuses, an effect of absorbing in the hydrogen barrier layer hydrogen that diffuses at the end surfaces of the upper-layer wire is added, and thereby deterioration of characteristics due to reduction of the resistance variable layer by the hydrogen gas can be prevented more surely.

Figure 10A:
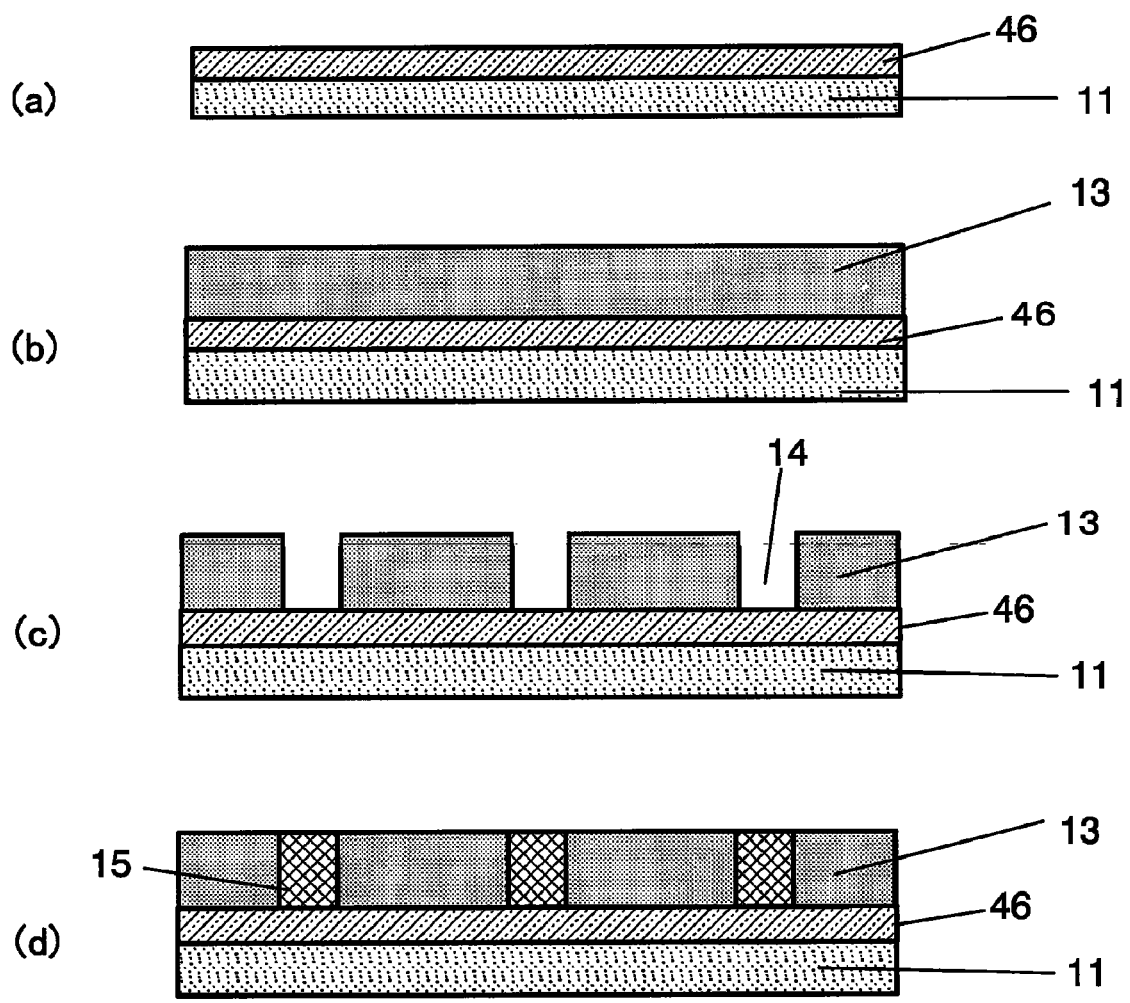
FIG. 10A shows schematic cross-sectional views of major process steps for explaining a method of manufacturing the nonvolatile semiconductor memory apparatus according to Embodiment 5 of the present invention, wherein FIG. 10A(a) is a cross-sectional view showing the state where the lower-layer wires are formed on the semiconductor substrate, FIG. 10A(b) is a cross-sectional view showing the state where the interlayer insulating film is formed, FIG. 10A(c) is a cross-sectional view showing the state where the contact holes are formed in the interlayer insulating film, and FIG. 10A(d) is a cross-sectional view showing the state where the resistance variable layers are formed in the contact holes.

Next, a method of manufacturing the nonvolatile semiconductor memory apparatus 45 according to this embodiment will be described with reference to FIG. 10. FIG. 10A and FIG. 10B are views illustrating major process steps for explaining the method of manufacturing the nonvolatile semiconductor memory apparatus of this embodiment. FIG. 10A(a) is a cross-sectional view showing the state where the lower-layer wires 46 are formed on the semiconductor substrate 11, FIG. 10A(b) is a cross-sectional view showing the state where the interlayer insulating film 13 is further formed, FIG. 10A(c) is a cross-sectional view showing the state where contact holes 14 are formed in the interlayer insulating film 13, and FIG. 10A(d) is a view showing the state where the resistance variable layers 15 are formed in the contact holes 14. Further, FIG. 10B(a) is a cross-sectional view showing the state where an interlayer insulating film 48 is formed over the entire surface so as to cover the resistance variable layers 15, FIG. 10B(b) is a cross-sectional view showing the state where the grooves 24 in which upper-layer wires 20 are to be embedded are formed in the interlayer insulating film 48, FIG. 10B(c) is a cross-sectional view showing the state where the thin film layer 26 which becomes the upper-layer wires 20 is formed on the interlayer insulating film 48, and FIG. 10B(d) is a cross-sectional view showing the state where the thin film layer 26 on the interlayer insulating film 48 is removed by CMP to form the upper-layer wires 20.

Initially, as shown in FIG. 10A(a), an electric conductor layer made of aluminum, copper or the like is formed on the semiconductor substrate 11, and processed into a predetermined pattern configuration using an exposure process and an etching or a CMP process, thereby forming the lower-layer wires 46 as the word lines for row selection.

Next, as shown in FIG. 10A(b), the interlayer insulating film 13 is formed. Since this interlayer insulating film 13 can be formed using the same material and method as those described for the nonvolatile semiconductor memory apparatus 10 of Embodiment 1, detailed description therefor will be omitted.

Next, as shown in FIG. 10A(c), the contact holes 14 are formed at predetermined positions in the interlayer insulating film 13 on the lower-layer wires 46, i.e., in regions where the upper-layer wires 20 which will be formed later cross the lower-layer wires 46. This is easily performed using an exposure process and an etching process.

Next, as shown in FIG. 10A(d), the resistance variable layers 15 are embedded in the contact holes 14. This step is, for example, carried out as follows. Initially, a thin film which becomes the resistance variable layers 15 is formed over the entire surface with the contact holes 14 being provided as shown in FIG. 10A(c). The formation of this thin film which becomes the resistance variable layers 15 can be performed using the same material and by the same process as those described in Embodiment 1. In this case, the film thickness of the thin film which becomes the resistance variable layers 15 is set so as to completely fill up the contact holes 14. Thereafter, the entire surface is etched to leave the resistance variable layers 15 only in the contact holes 14. Thereby, the configuration in which the resistance variable layers 15 are embedded in the contact holes 14 as shown in FIG. 10A(d) is obtained.

Figure 10B:
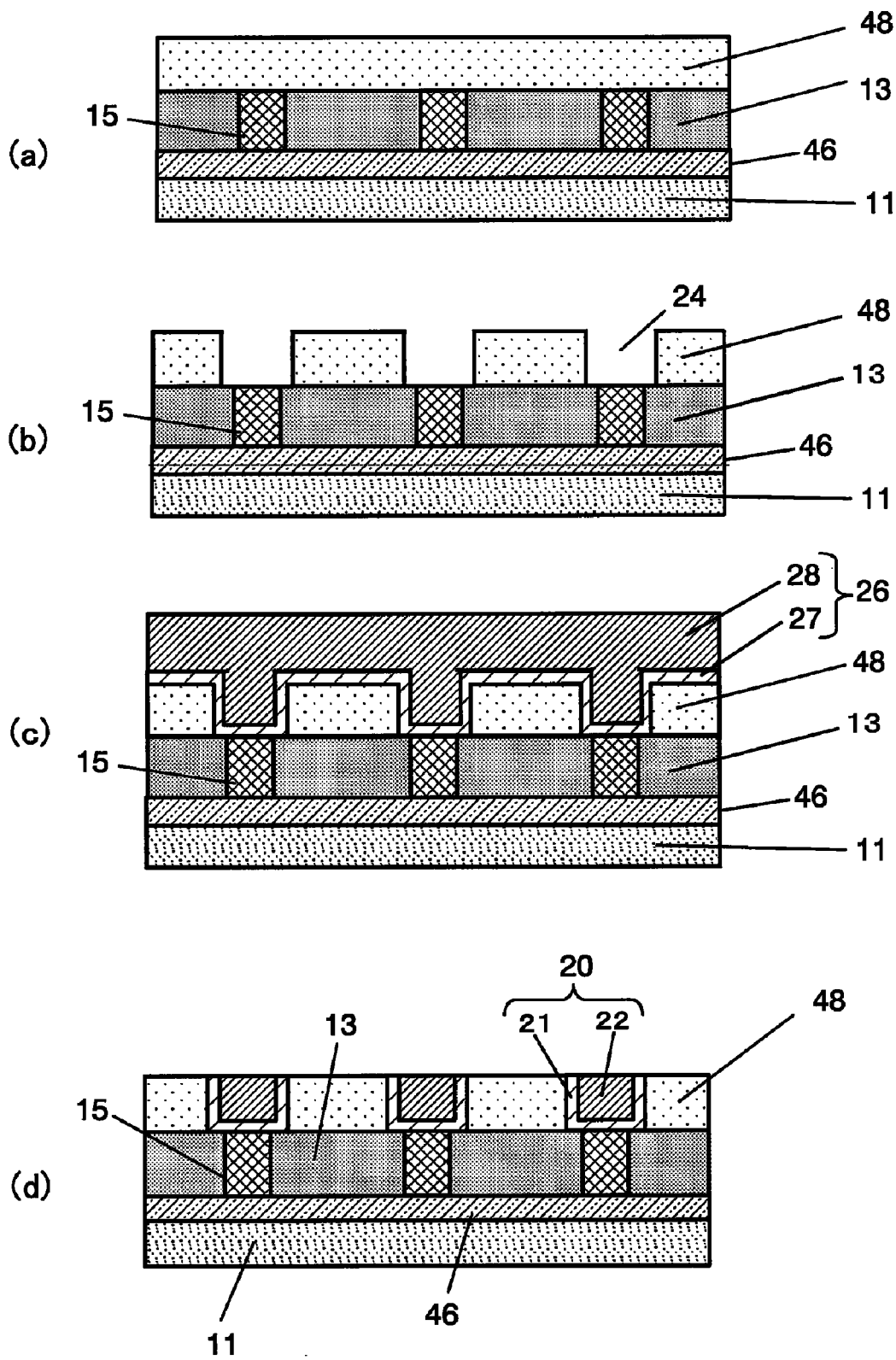
FIG. 10B shows schematic cross-sectional views of major process steps for explaining the method of manufacturing the nonvolatile semiconductor memory apparatus according to Embodiment 5 of the present invention, wherein FIG. 10B(a) is a cross-sectional view showing the state where the interlayer insulating film is formed to cover the resistance variable layers, FIG. 10B(b) is a cross-sectional view showing the state where the grooves for forming the upper-layer wires are formed in the interlayer insulating film, FIG. 10B(c) is a cross-sectional view showing the state where a thin film layer which becomes the upper-layer wires is formed on the interlayer insulating film, and FIG. 10B(d) is a cross-sectional view showing the state where the thin film layer on the interlayer insulating film is removed by CMP to form the upper-layer wires.

Next, as shown in FIG. 10B(a), the interlayer insulating film 48 is formed over the entire surface so as to cover the resistance variable layers 15. Since this interlayer insulating film 48 can be formed using the same material and method as those described for the nonvolatile semiconductor memory apparatus 10 of Embodiment 1, detailed description will be omitted.

Next, as shown in FIG. 10B(b), portions of the interlayer insulating film 48 which cross the lower-layer wires 46 and are positioned on the resistance variable layers 15 are removed to form the grooves 24 in which the upper-layer wires 20 are to be embedded. This is easily carried out using an exposure process and an etching process.

Next, as shown in FIG. 10B(c), the thin film layer 26 which becomes the upper-layer wires 20 is formed. In this case, the thin film layer 26 has a laminated-layer structure including the first thin film layer 27 which is made of an electrically-conductive hydrogen barrier material and formed on the resistance variable layers 15, and a second thin film layer 28 which is made of a material having a relatively low specific resistance such as copper and formed on the first thin film layer 27.

Next, as shown in FIG. 10B(d), the thin film layer 26 on the interlayer insulating film 48 is polished and removed by CMP, thereby forming the upper-layer wires 20 in the grooves 24 formed in the interlayer insulating film 48. In this case, the electrically-conductive hydrogen barrier layer 21 is formed at bottom and side surfaces of each upper-layer wire 20.

In the nonvolatile semiconductor memory apparatus 45 of this embodiment, since the electrically-conductive hydrogen barrier layer 21 is provided so as to also cover the side walls of the electric conductor layer 22, the hydrogen gas can be effectively blocked, even when diffusion or the like from the side surfaces of the upper-layer wire occurs.

The manufacturing step for the nonvolatile semiconductor memory apparatus 45 of this embodiment is not limited to that mentioned above. For example, the resistance variable layers 15 shown in FIG. 10A(d) may be formed as follows. To be specific, after the contact holes 14 are opened, the resistance variable layers 15 may be formed and embedded in the contact holes 14 by electroless plating using, as a mask, a photoresist film formed for the openings of the contact holes 14. It should be noted that in this method, the resistance variable layers 15 must be formed of a material which is capable of being plated.

Through the above-described process steps, the major part of the nonvolatile semiconductor memory apparatus 45 of this embodiment can be manufactured, and moreover, a cross-point type nonvolatile semiconductor memory apparatus can be manufactured by connecting the lower-layer wires 46 and the upper-layer wires 20 to the semiconductor circuits (not shown), and forming desired interlayer insulating films, protective films, and the like.

Embodiment 6

Figure 12:
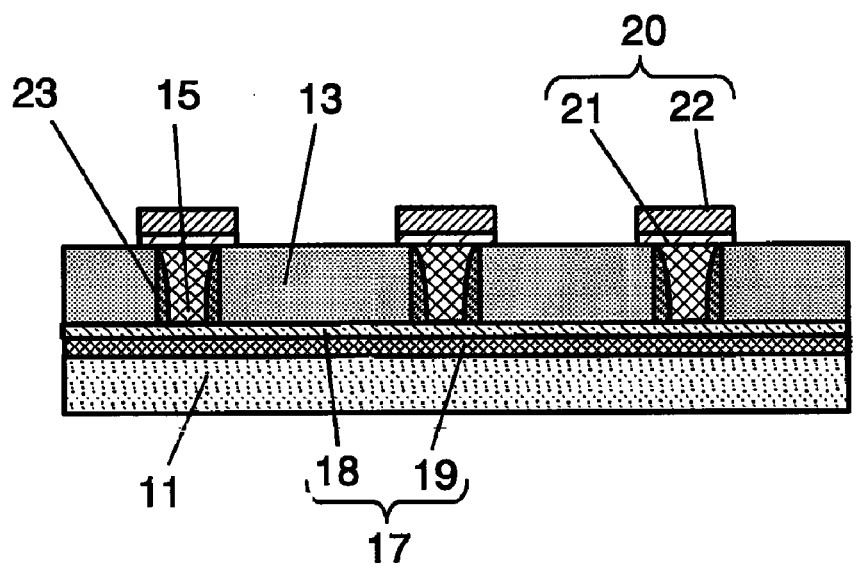
FIG. 12 is a schematic cross-sectional view illustrating a configuration of a nonvolatile semiconductor memory apparatus according to Embodiment 6 of the present invention.

FIG. 12 is a schematic cross-sectional view illustrating a configuration of a nonvolatile semiconductor memory apparatus 50 according to Embodiment 3 of the present invention. The nonvolatile semiconductor memory apparatus 50 of this embodiment has the features as follows. First, each of a lower-layer wire 17 and an upper-layer wire 20 has a double-layer structure in such a way that the lower-layer wire 17 includes the electrically-conductive hydrogen barrier layer 18 and the electric conductor layer 19 having a specific resistance lower than that of the electrically-conductive hydrogen barrier layer 18 and the upper-layer wire 20 includes the electrically-conductive hydrogen barrier layer 21 and the electric conductor layer 22 having a specific resistance lower than that of the electrically-conductive hydrogen barrier layer 21. Second, a side wall 23 made of an insulating hydrogen barrier material having a hydrogen barrier property is formed on the inner wall surface of each contact hole 14, and the resistance variable layer 15 is embedded in an internal space of the contact hole 14, which is defined by the side wall 23. An insulating material containing either of silicon nitride or silicon oxide nitride can be used as the insulating hydrogen barrier material.

With such a configuration, diffusion of the hydrogen gas into the side wall of the resistance variable layer 15 can be prevented by forming the side wall 23 having a hydrogen barrier property only in the contact hole 14, while using a low-stress material such as TEOS—SiO$_2$ for the interlayer insulating film 13. This is due to the fact that the entire of the resistance variable layer 15 is covered with the lower-layer wire 17, the upper-layer wire 20, and the side wall 23 which have a hydrogen barrier property.

Figure 13:
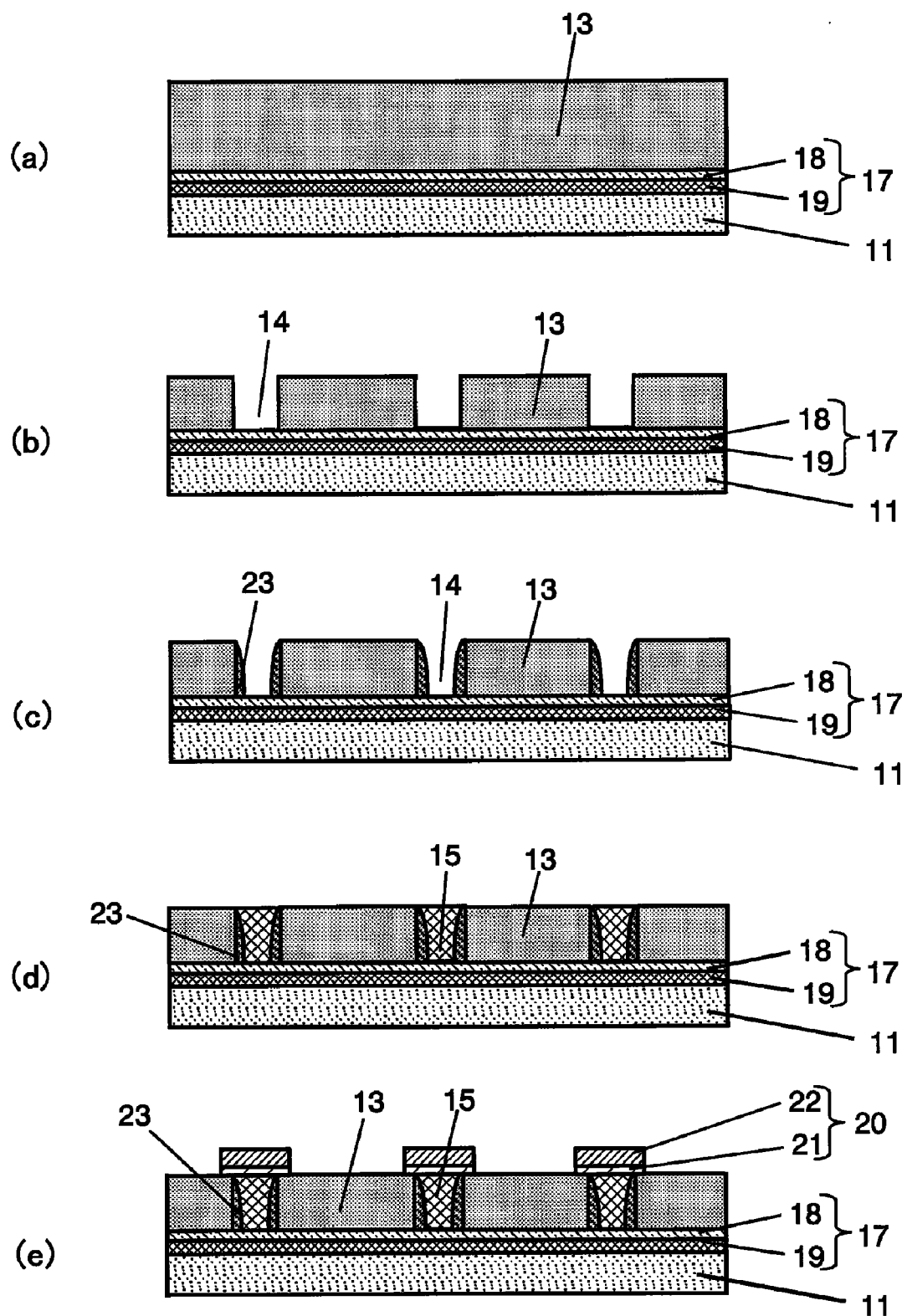

FIG. 13 shows cross-sectional views of major process steps for explaining the method of manufacturing a major part of a memory area of the nonvolatile semiconductor memory apparatus 50 of this embodiment, wherein FIG. 13(a) is a cross-sectional view showing the state where the lower-layer wires 17 are formed on the semiconductor substrate 11 and further the interlayer insulating film 13 is formed thereon, FIG. 13(b) is a cross-sectional view showing the state where the contact holes 14 are formed in the interlayer insulating film 13, FIG. 13(c) is a cross-sectional view showing the state where the side walls 23 made of an insulating hydrogen barrier material are formed in the contact holes 14, FIG. 13(d) is a cross-sectional view showing the state where the resistance variable layers 15 are embedded in the contact holes 14, and FIG. 13(e) is a cross-sectional view showing the state where upper-layer wires 20 are formed.

Initially, as shown in FIG. 13(a), the electrically-conductive hydrogen barrier layer 18 made of an electrically-conductive material such as Ti—Al—N and the electric conductor layer 19 made of copper are deposited to be laminated on the semiconductor substrate 11, and processed into a predetermined pattern configuration using an exposure process and an etching process, thereby forming the lower-layer wires 17 as the word lines for row selection.

Next, the interlayer insulating film 13 is formed on the semiconductor substrate 11 provided with the lower-layer wires 17. Since this interlayer insulating film 13 can be formed using the same material and method as those described for the nonvolatile semiconductor memory apparatus 10 of Embodiment 1, detailed description thereof will be omitted.

Next, as shown in FIG. 13(b), the contact holes 14 are formed at predetermined positions in the interlayer insulating film 13 on the lower-layer wires 17, i.e., in regions where the upper-layer wires 20 which will be formed later cross the lower-layer wires 17. This can be easily carried out using an exposure process and an etching process.

Next, as shown in FIG. 13(c), the side walls 23 made of an insulating hydrogen barrier material are formed in the contact holes 14 formed in the interlayer insulating film 13. For example, after silicon nitride or silicon oxide nitride is deposited by a CVD process or the like, the side walls 23 formed of a silicon nitride film or a silicon oxide nitride film can be formed on only the inner wall surfaces of the contact holes 14 by appropriately setting a dry etching condition. To be specific, when a silicon nitride film is deposited by the CVD process and dry-etching is carried out under an anisotropic condition using, for example, a CHF3 gas, the silicon nitride film adhering onto regions other than the inner side wall surfaces of the contact holes 14 is etched away, thereby forming the side walls 23 formed of the silicon nitride film in the contact holes 14.

Next, as shown in FIG. 13(d), the resistance variable layers 15 are embedded in the inner spaces of the contact holes 14 which are defined by the side walls 23. Since this step is identical to the step described for the method of manufacturing the nonvolatile semiconductor memory apparatus 10 of Embodiment 1, description thereof will be omitted.

Next, as shown in FIG. 13(e), the upper-layer wires 20 are formed. Each upper-layer wire 20 has a double-layer structure including an electrically-conductive hydrogen barrier layer 21 on the side contacting the resistance variable layer 15, and an electric conductor layer 22 having a relatively low specific resistance which is formed on the electrically-conductive hydrogen barrier layer 21.

Through the above-described process steps, the nonvolatile semiconductor memory apparatus 50 of this embodiment is manufactured. In the nonvolatile semiconductor memory apparatus 50 thus configured, the upper and lower surfaces of each resistance variable layer 15 are covered with the lower-layer wire 17 and the upper-layer wire 20, respectively, and the side surface of the resistance variable layer 15 is covered with the side wall 23 made of the insulating hydrogen barrier material. Accordingly, even when the hydrogen gas or the like is generated during the step after formation of the memory portions, for example, formation of an interlayer insulating film or formation of a passivation film, it is possible to effectively prevent penetration of the hydrogen gas into the resistance variable layer 15 due to diffusion, etc.

When the interlayer insulating film 13 is formed of a silicon nitride film or the like, defects are likely to occur due to an increased stress. In this embodiment, however, since a TEOS—SiO$_2$ film having a relatively low stress is used as the interlayer insulating film and the silicon nitride films are formed only on the inner wall surfaces of the contact holes 14, the stress can be reduced as a whole, and occurrence of defects based on the stress can be suppressed. Even when such a low-stress interlayer insulating film is used, deterioration in characteristics of the resistance variable layers 15 can be effectively prevented even if a step is performed under a hydrogen gas atmosphere after formation of the resistance variable layers 15. Further, a low-dielectric interlayer insulating film such as a fluorinated oxide film (FSG) which is used for avoiding wire delay generates hydrogen during film formation, causing a strong reduction atmosphere. Even when such an interlayer insulating film is used, deterioration in characteristics of the resistance variable layers 15 can be prevented. Furthermore, the ordinary semiconductor process can be used without changing it.

Embodiment 7

Figure 14:
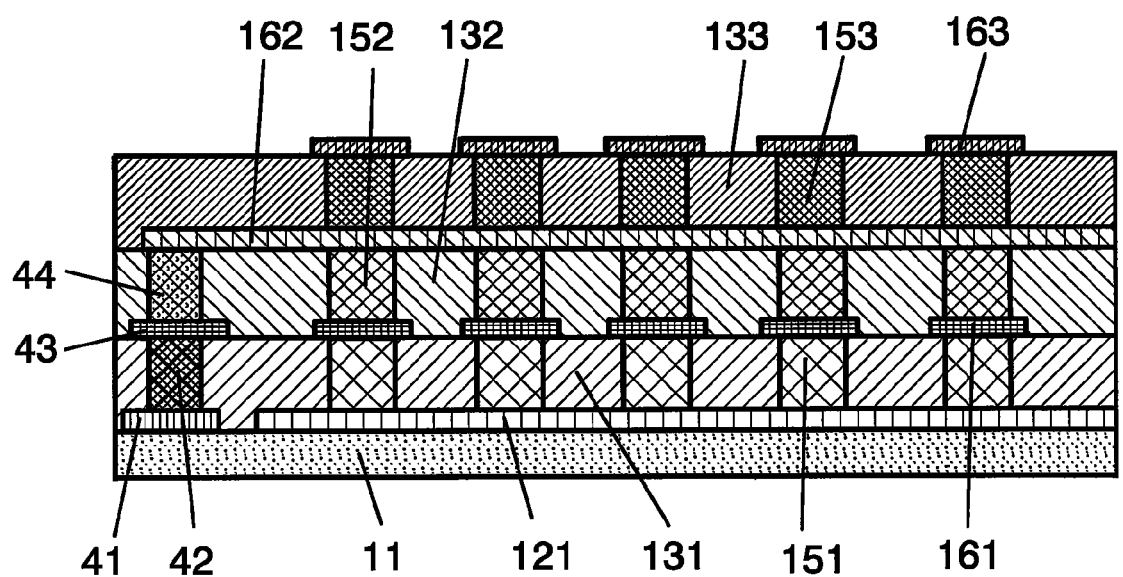
FIG. 14 is a schematic cross-sectional view illustrating a configuration of a major part of a nonvolatile semiconductor memory apparatus according to Embodiment 7 of the present invention.

FIG. 14 is a schematic cross-sectional view showing a configuration of a major part of a nonvolatile semiconductor memory apparatus 55 according to Embodiment 4 of the present invention. The nonvolatile semiconductor memory apparatus 55 of this embodiment is characterized in that memory portions are stacked in multi-stages.

To be specific, the nonvolatile semiconductor memory apparatus 55 comprises N (N: an integer of 2 or larger) stages of laminated-layer units, each laminated-layer unit including the semiconductor substrate 11, the lower-layer wires formed on the semiconductor substrate 11, the interlayer insulating film formed on the semiconductor substrate 11 provided with the lower-layer wires, the resistance variable layers which are embedded in the contact holes formed at predetermined positions in the interlayer insulating film and are connected to the lower-layer wires, and the upper-layer wires which are formed on the interlayer insulating film and are connected to the resistance variable layers. In this embodiment, N=3.

The upper-layer wires in (M−1)th (M: an integer that is not smaller than 2 and not larger than N) laminated-layer unit serve as the lower-layer wires in the M-th laminated-layer unit. Further, the lower-layer wires and the upper-layer wires in each laminated-layer unit are formed to cross each other, the contact holes are formed in the crossing regions, each memory portion is composed of the resistance variable layer, and the lower-layer wire and the upper-layer wire sandwiching the resistance variable layer, and the lower-layer wires and the upper-layer wires include at least electrically-conductive hydrogen barrier layers, respectively.

Hereinafter, the specific configuration will be described with reference to FIG. 14. In the nonvolatile semiconductor memory apparatus 55 of this embodiment, the configuration of the first stage is fundamentally identical to that of the nonvolatile semiconductor memory apparatus 10 of Embodiment 1. However, the first stage of the memory apparatus 55 is different from that of the memory apparatus 10 in that an embedded electric conductor 42 is formed in a contact hole to connect the upper-layer wires 162 in the second stage to a connection wire 41 on the semiconductor substrate 11, and a connection electrode 43 is formed on the embedded electric conductor 42. A second laminated-layer unit and a third laminated-layer unit having similar configurations to the first laminated-layer unit are provided on the first laminated-layer unit.

The upper-layer wires 161 in the first laminated-layer unit also serve as the lower-layer wires in the second laminated-layer unit. Accordingly, hereinafter, such common wires are referred to as "upper-layer wires 161" when the first laminated-layer unit is described and are referred to as "lower-layer wires 161" when the second laminated-layer unit is described. Further, the lower-layer wires 121 and the upper-layer wires 161 in the first laminated-layer unit are formed to cross each other with the interlayer insulating film 131 interposed therebetween, the contact holes are formed in the crossing regions, and each memory portion is composed of the resistance variable layer 151, and the lower-layer wire 121 and the upper-layer wire 161 sandwiching the resistance variable layer 151. Each lower-layer wire 121 and each upper-layer wire 161 include at least electrically-conductive hydrogen barrier layers, respectively.

The upper-layer wires 162 in the second laminated-layer unit also serve as the lower-layer wires in the third laminated-layer unit. Accordingly, hereinafter, such common wires are referred to as "upper-layer wires 162" when the second laminated-layer unit is described and are referred to as "lower-layer wires 162" when the third laminated-layer unit is described. Further, the lower-layer wires 161 and the upper-layer wires 162 in the second laminated-layer unit are formed to cross each other, the contact holes are formed in the crossing regions, and each memory portion is composed of the resistance variable layer 152, and the lower-layer wire 161 and the upper-layer wire 162 sandwiching the resistance variable layer 152. Each lower-layer wire 161 and each upper-layer wire 162 include at least electrically-conductive hydrogen barrier layers, respectively.

On the other hand, the upper-layer wires 163 in the third laminated-layer unit are not shared because there is not a fourth laminated-layer unit. The lower-layer wires 162 and the upper-layer wires 163 in the third laminated-layer unit are formed to cross each other, the contact holes are formed in the crossing regions, and each memory portion is composed of the resistance variable layer 153, and the lower-layer wire 162 and the upper-layer wire 163 sandwiching the resistance variable layer 153. Each lower-layer wire 162 and each upper-layer wire 163 include at least electrically-conductive hydrogen barrier layers, respectively, as in the first and second laminated-layer units.

In the second laminated-layer unit and the third laminated-layer unit, interlayer insulating films 132 and 133 are formed, respectively. Further, in the second laminated-layer unit, in order to connect the upper-layer wires 162 in this laminated-layer unit to the connection wires 41 on the semiconductor substrate 11, the embedded electric conductors 44 are formed in the contact holes and connected to the connection electrodes 43.

In the nonvolatile semiconductor memory apparatus 55 of this embodiment, the lower-layer wires and the upper-layer wires in the first to third laminated-layer units are made of an electrically-conductive material having a hydrogen barrier property.

With the above-described configuration, it is possible to attain the cross-point type nonvolatile semiconductor memory apparatus 55 in which the laminated-layer units are three-dimensionally stacked to provide larger-capacity memory portions, and fluctuation in characteristics can be significantly suppressed even when the hydrogen gas is generated in the step of forming the laminated-layer units or subsequent steps of forming the interlayer insulating films or the passivation films.

Figure 15:
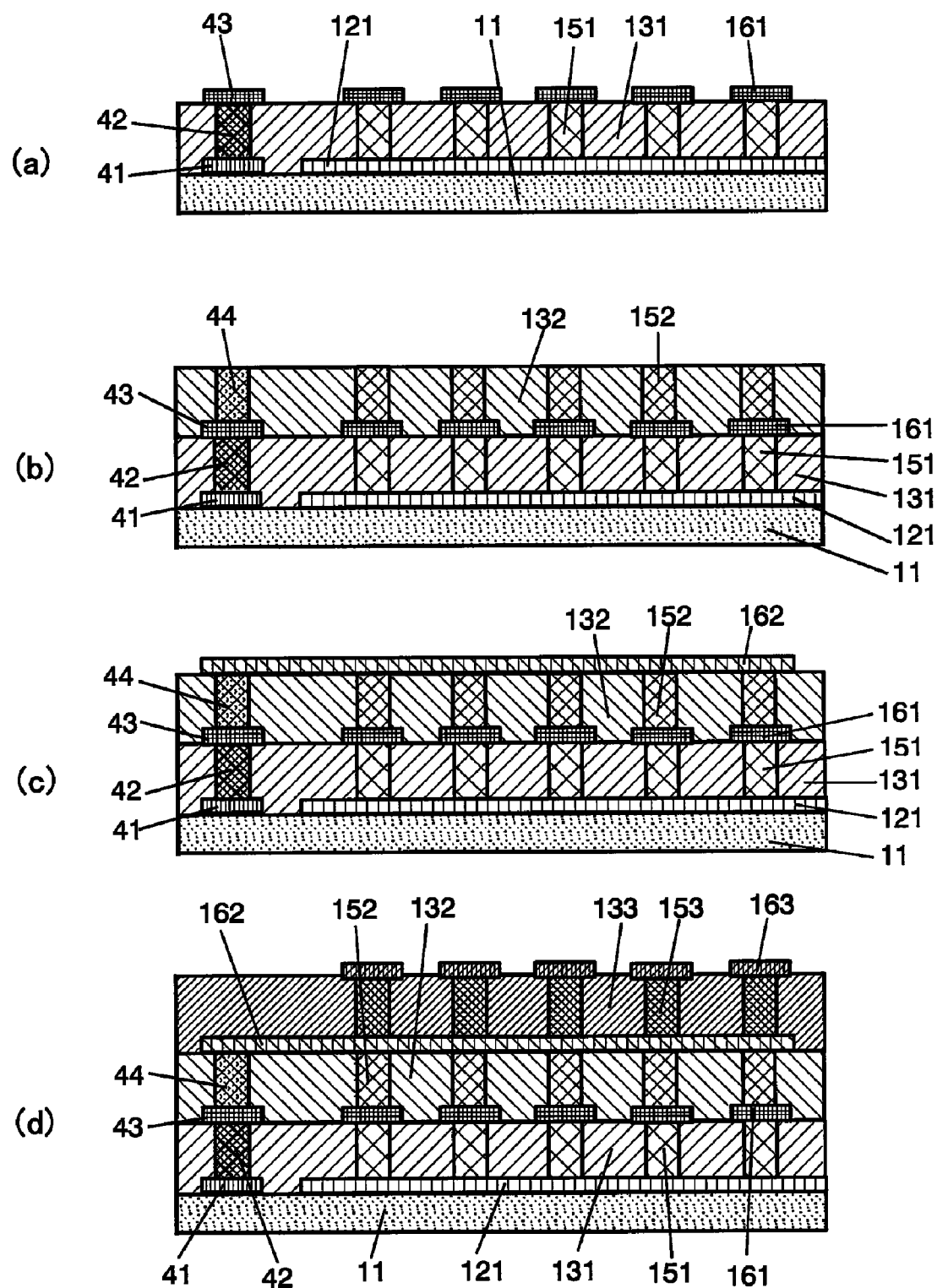

FIG. 15 shows cross-sectional views of major process steps for explaining a method of manufacturing the nonvolatile semiconductor memory apparatus 55 of this embodiment, wherein FIG. 15(a) is a cross-sectional view showing the state where the first laminated-layer unit is formed, FIG. 15(b) is a cross-sectional view showing the state before formation of the upper-layer electrodes of the second laminated-layer unit, FIG. 15(c) is a cross-sectional view showing the state where the upper-layer electrodes in the second laminated-layer unit are formed, and FIG. 15(d) is a cross-sectional view showing the state where the third laminated-layer unit is formed.

As shown in FIG. 15(a), the first laminated-layer unit is formed on the semiconductor substrate 11. Since this step is almost the same as that in the method of manufacturing the nonvolatile semiconductor memory apparatus 10 of Embodiment 1, description thereof will be omitted. Nonetheless, the manufacturing method of Embodiment 1 does not include the step of forming the contact holes in the interlayer insulating film 131 and forming the embedded electric conductors 42 in the contact holes, the step of forming the connection electrodes 43 on the embedded electric conductors 42, and the step of connecting the lower-layer wires 162 to the connection electrodes 43, in order to connect the upper-layer wires 162 in the second stage to the connection wires 41 on the semiconductor substrate 11. Since these steps can be performed using the ordinary semiconductor process, description thereof will be omitted.

Next, as shown in FIGS. 15(b) and 15(c), the second laminated-layer unit is formed. In this case, as in the first laminated-layer unit, the step of forming the embedded electric conductors 44 and connecting them to the connection electrodes 43 is performed, and also this step is identical to that described for the first laminated-layer unit. In this manner, the second laminated-layer unit is formed as shown in FIG. 15(c).

Next, as shown in FIG. 15(d), the third laminated-layer unit is formed. The manufacturing step for this third laminated-layer unit may be identical to that in the manufacturing method of the nonvolatile semiconductor memory apparatus 10 of Embodiment 1. As described above, the lower-layer wires and the upper-layer wires in each laminated-layer unit are arranged so as to cross each other, and the resistance variable layers are formed in the crossing regions. As shown in FIG. 15, the wires which are the upper-layer wires 162 in the second laminated-layer unit and the lower-layer wires 162 in the third laminated-layer unit are connected to the connection wires 41 via the embedded electric conductors 42 and 44 and the connection electrodes 43, and are connected to the semiconductor circuits (not shown). The wires which are the lower-layer wires 161 in the second laminated-layer unit and the upper-layer wires 161 in the first laminated-layer unit are connected to the semiconductor circuits in an area which is not shown. Likewise, the lower-layer wires 121 in the first laminated-layer unit are also connected to the semiconductor circuits in an area which is not shown.

Through the above-described manufacturing steps, the nonvolatile semiconductor memory apparatus 55 of this embodiment is manufactured. Whereas in this embodiment the three-stage configuration with N=3 set is described, the value of N is not particularly limited, and ten or twenty stages may be used so long as they are permitted in the semiconductor process. As for the number of stack stages, optimal number should be set by comparing the wire pitch and the focus margin in lithography, etc with the process cost.

Figure 16:
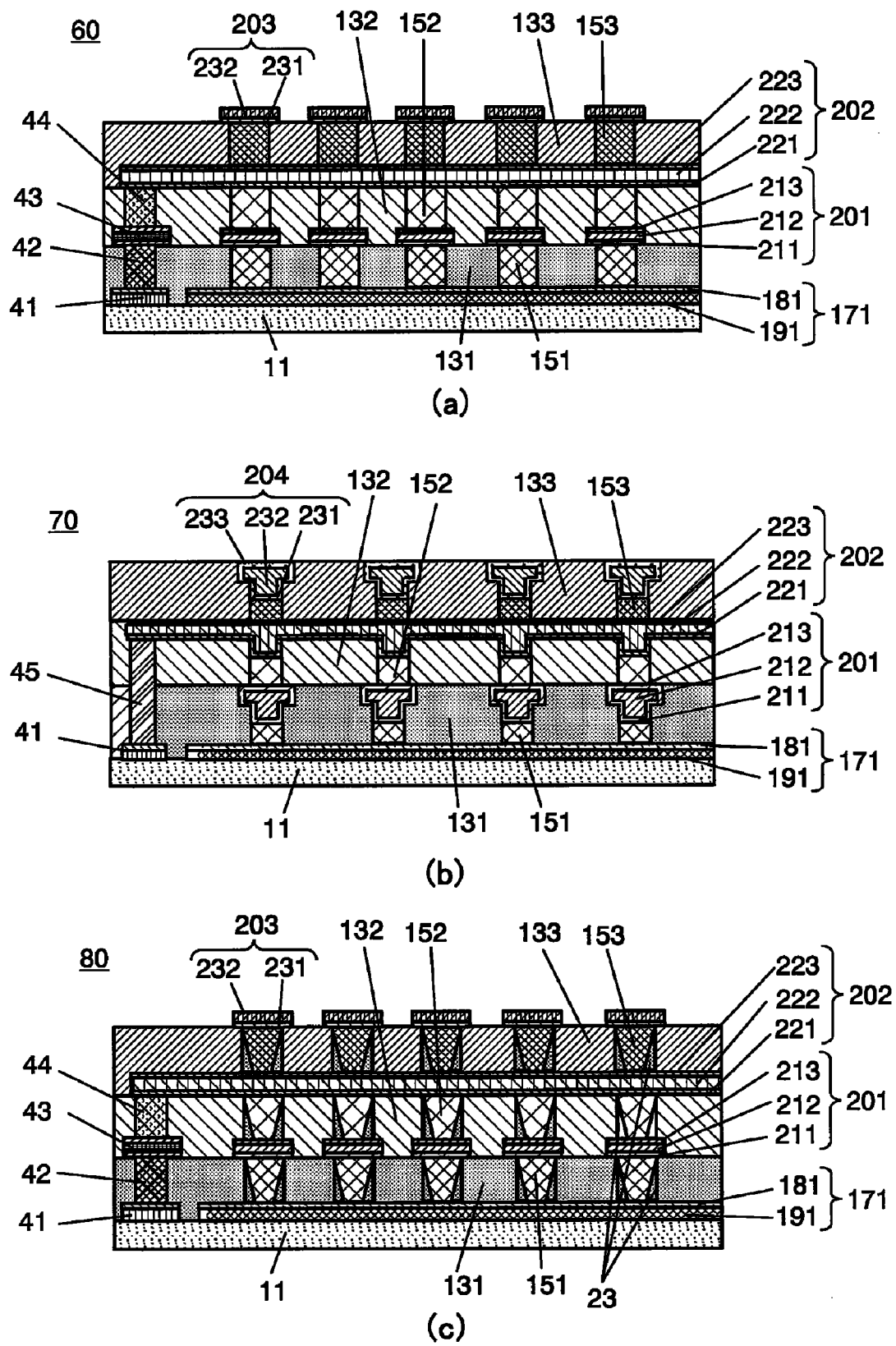

FIG. 16 shows schematic cross-sectional views of configurations of nonvolatile semiconductor memory apparatuses according to modifications of this embodiment, wherein FIG. 16(a) is a cross-sectional view of a nonvolatile semiconductor memory apparatus 60 in which each of the lower-layer wire and the upper-layer wire has a laminated-layer structure including an electrically-conductive hydrogen barrier layer and an electric conductor layer having a specific resistance lower than that of the electrically-conductive hydrogen barrier layer, FIG. 16(b) is a cross-sectional view of a nonvolatile semiconductor memory apparatus 70 in which portions of the upper-layer wires are embedded in the contact holes, and the upper-layer wires are entirely embedded in the grooves formed in the interlayer insulating film, and FIG. 16(c) is a cross-sectional view of a nonvolatile semiconductor memory apparatus 80 in which the side walls made of an insulating hydrogen barrier material having a hydrogen barrier property are formed on the inner walls of the contact holes.

The nonvolatile semiconductor memory apparatus 60 shown in FIG. 16(a) is based on the configuration of the nonvolatile semiconductor memory apparatus 25 according to the modification of Embodiment 1. The configuration of the first stage of the nonvolatile semiconductor memory apparatus 60 is fundamentally identical to that of the nonvolatile semiconductor memory apparatus 25 according to the modification of Embodiment 1. Nonetheless, the nonvolatile semiconductor memory apparatus 60 is different from the nonvolatile semiconductor memory apparatus 25 in that the embedded electric conductors 42 are formed in the contact holes and the connection electrodes 43 are formed on the embedded electric conductor 42 in order to connect the upper-layer wire 202 in the second stage to the connection wires 41 on the semiconductor substrate 11. The second laminated-layer unit and the third laminated-layer unit having similar configurations to the first laminated-layer unit are provided on the first laminated-layer unit.

The upper-layer wires 201 in the first laminated-layer unit also serve as the lower-layer wires in the second laminated-layer unit. Accordingly, hereinafter, such common wires are referred to as "upper-layer wires 201" when the first laminated-layer unit is described and are referred to as "lower-layer wires 201" when the second laminated-layer unit is described. Further, the lower-layer wires 171 and the upper-layer wires 201 in the first laminated-layer unit are formed to cross each other, the contact holes are formed in the crossing regions, and each memory portion is composed of the resistance variable layer 151, and the lower-layer wire 171 and the upper-layer wire 201 sandwiching the resistance variable layer 151. Each lower-layer wire 171 has a double-layer structure including an electrically-conductive hydrogen barrier layer 181 and an electric conductor layer 191 having a specific resistance lower than that of the electrically-conductive hydrogen barrier layer 181. Further, each upper-layer wire 201 has a triple-layer structure including electrically-conductive hydrogen barrier layers 211 and 213 on the side contacting the resistance variable layers 151 and 152, respectively, and an electric conductor layer 212 sandwiched between the barrier layers 211 and 213.

The upper-layer wires 202 in the second laminated-layer unit also serve as the lower-layer wires in the third laminated-layer unit. Accordingly, hereinafter, such common wires are referred to as "upper-layer wires 202" when the second laminated-layer unit is described and are referred to as "lower-layer wires 202" when the third laminated-layer unit is described. The lower-layer wires 201 and the upper-layer wires 202 in the second laminated-layer unit are formed to cross each other, the contact holes are formed in the crossing regions, and each memory portion is composed of the resistance variable layer 152, and the lower-layer wire 201 and the upper-layer wire 202 sandwiching the resistance variable layer 152. Each upper-layer wire 202 has a triple-layer structure including electrically-conductive hydrogen barrier layers 221 and 223 formed on the side contacting the resistance variable layers 152 and 153, respectively, and an electric conductor layer 222 sandwiched between the layers 221 and 223, as in the lower-layer wires 201.

On the other hand, the upper-layer wires 203 in the third laminated-layer unit are not shared because there is not a fourth laminated-layer unit. The lower-layer wires 202 and the upper-layer wires 203 in the third laminated-layer unit are formed to cross each other, the contact holes are formed in the crossing regions, and each memory portion is composed of the resistance variable layer 153, and the lower-layer wire 202 and the upper-layer wire 203 sandwiching the resistance variable layer 153. Each upper-layer wire 203 has a double-layer structure including an electrically-conductive hydrogen barrier layer 231 and an electric conductor layer 232 having a specific resistance lower than that of the electrically-conductive hydrogen barrier layer 231.

In the second laminated-layer unit and the third laminated-layer unit, the interlayer insulating films 132 and 133 are formed, respectively. Further, in the second laminated-layer unit, in order to connect the upper-layer wires 202 in this laminated-layer unit to the connection wires 41 on the semiconductor substrate 11, the embedded electric conductors 44 are formed in the contact holes and connected to the connection electrodes 43. Whereas the connection wires 41 are made of the same material as the lower-layer wires 171 in the first laminated-layer unit and the connection electrodes 43 are made of the same material as the upper-layer wires 201 of the first laminated-layer unit, it is not always necessary to use the same material.

With the above-described configuration, it is possible to attain the cross-point type nonvolatile semiconductor memory apparatus 60 in which the laminated-layer units are three-dimensionally stacked to provide larger-capacity memory portions, and fluctuation in characteristics can be significantly suppressed even when the hydrogen gas is generated in the step of forming the laminated-layer units or subsequent steps of forming the interlayer insulating films or the passivation films.

The nonvolatile semiconductor memory apparatus 70 shown in FIG. 16(b) is based on the configuration of the nonvolatile semiconductor memory apparatus 30 according to Embodiment 2. The configuration of the first stage of the nonvolatile semiconductor memory apparatus 70 is fundamentally identical to that of the nonvolatile semiconductor memory apparatus 30 according to the modification of Embodiment 2. The second laminated-layer unit and the third laminated-layer unit having similar configurations to the first laminated-layer unit are provided on the first laminated-layer unit.

The upper-layer wires 201 in the first laminated-layer unit also serve as the lower-layer wires in the second laminated-layer unit. Accordingly, hereinafter, such common wires are referred to as "upper-layer wires 201" when the first laminated-layer unit is described and are referred to as "lower-layer wires 201" when the second laminated-layer unit is described. The lower-layer wires 171 and the upper-layer wires 201 in the first laminated-layer unit are formed to cross each other, the contact holes are formed in the crossing regions, and each memory portion is composed of the resistance variable layer 151, and the lower-layer wire 171 and the upper-layer wire 201 sandwiching the resistance variable layer 151.

Each lower-layer wire 171 has a double-layer structure including an electrically-conductive hydrogen barrier layer 181 and an electric conductor layer 191 having a specific resistance lower than that of the electrically-conductive hydrogen barrier layer 181. Each upper-layer wire 201 has a triple-layer structure including the electrically-conductive hydrogen barrier layers 211 and 213 formed on the side contacting the resistance variable layers 151 and 152, respectively, and the electric conductor layer 212 sandwiched between the barrier layers 211 and 213. Further, portions of the upper-layer wires 201 are embedded in the contact holes and the entire upper-layer wires 201 are embedded in the grooves formed in the interlayer insulating film 131.

The upper-layer wires 202 in the second laminated-layer unit also serve as the lower-layer wires in the third laminated-layer unit. Accordingly, hereinafter, such common wires are referred to as "upper-layer wires 202" when the second laminated-layer unit is described and are referred to as "lower-layer wires 202" when the third laminated-layer unit is described. The lower-layer wires 201 and the upper-layer wires 202 in the second laminated-layer unit are formed to cross each other, the contact holes are formed in the crossing regions, and each memory portion is composed of the resistance variable layer 152, and the lower-layer wire 201 and the upper-layer wire 202 sandwiching the resistance variable layer 152. Each upper-layer wire 202 has a triple-layer structure including electrically-conductive hydrogen barrier layers 221 and 223 on the side contacting the resistance variable layers 152 and 153, respectively, and an electric conductor layer 222 sandwiched between the layers 221 and 223, as in the lower-layer wire 201. Further, portions of the upper-layer wires 202 are embedded in the contact holes and the entire upper-layer wires 202 are embedded in the grooves formed in the interlayer insulating film 132.

On the other hand, upper-layer wires 204 in the third laminated-layer unit are not shared because there is not a fourth laminated-layer unit. However, the lower-layer wires 202 and the upper-layer wires 204 in the third laminated-layer unit are formed to cross each other, the contact holes are formed in the crossing regions, and each memory portion is composed of the resistance variable layer 153, and the lower-layer wire 202 and the upper-layer wire 204 sandwiching the resistance variable layer 153. Each upper-layer wire 204 has a triple-layer structure including electrically-conductive hydrogen barrier layers 231 and 233 and an electric conductor layer 232 having a specific resistance lower than that of the electrically-conductive hydrogen barrier layers 231 and 233. Further, portions of the upper-layer wires 204 are embedded in the contact holes and the entire upper-layer wires 204 are embedded in the grooves formed in the interlayer insulating film 133.

In the second laminated-layer unit and the third laminated-layer unit, the interlayer insulating films 132 and 133 are formed, respectively. The contact holes are formed in these interlayer insulating films 132 and 133 to connect the upper-layer wires 202 in the second laminated-layer unit to the connection wires 41 on the semiconductor substrate 11, and the embedded electric conductors 45 are formed in the contact holes and directly connected to the connection wires 41.

With the above-described configuration, it is possible to attain the cross-point type nonvolatile semiconductor memory apparatus 70 in which the laminated-layer units are three-dimensionally stacked to provide larger-capacity memory portions, and fluctuation in characteristics can be significantly suppressed even when the hydrogen gas is generated in the step of forming the laminated-layer units or subsequent steps of forming the interlayer insulating films or the passivation films.

The nonvolatile semiconductor memory apparatus 80 shown in FIG. 16(*c*) is based on the configuration of the nonvolatile semiconductor memory apparatus 50 according to Embodiment 3. The configuration of the first stage of the nonvolatile semiconductor memory apparatus 80 is fundamentally identical to that of the nonvolatile semiconductor memory apparatus 50 according to Embodiment 6. Nonetheless, the nonvolatile semiconductor memory apparatus 80 is different from the nonvolatile semiconductor memory apparatus 50 in that the embedded electric conductors 42 are formed in the contact holes and the connection electrodes 43 are formed on the embedded electric conductors 42 in order to connect the upper-layer wires 202 in the second stage to the connection wires 41 on the semiconductor substrate 11. The second laminated-layer unit and the third laminated-layer unit having similar configurations to the first laminated-layer unit are provided on the first laminated-layer unit.

The upper-layer wires 201 in the first laminated-layer unit also serve as the lower-layer wires in the second laminated-layer unit. Accordingly, hereinafter, the common wires are referred to as "upper-layer wires 201" when the first laminated-layer unit is described and are referred to as "lower-layer wires 201" when the second laminated-layer unit is described. The lower-layer wires 171 and the upper-layer wires 201 in the first laminated-layer unit are formed to cross each other, the contact holes are formed in the crossing regions, and each memory portion is composed of the resistance variable layer 151, and the lower-layer wire 171 and the upper-layer wire 201 sandwiching the resistance variable layer 151. Each lower-layer wire 171 has a double-layer structure including the electrically-conductive hydrogen barrier layer 181 and the electric conductor layer 191 having a specific resistance lower than that of the electrically-conductive hydrogen barrier layer 181. Further, each upper-layer wire 201 has a triple-layer structure including the electrically-conductive hydrogen barrier layers 211 and 213 formed on the side contacting the resistance variable layers 151 and 152, respectively, and the electric conductor layer 212 sandwiched between the layers 211 and 213.

The upper-layer wires 202 in the second laminated-layer unit also serve as the lower-layer wires in the third laminated-layer unit. Accordingly, hereinafter, such common wires are referred to as "upper-layer wires 202" when the second laminated-layer unit is described and are referred to as "lower-layer wires 202" when the third laminated-layer unit is described. The lower-layer wires 201 and the upper-layer wires 202 in the second laminated-layer unit are formed to cross each other, the contact holes are formed in the crossing regions, and each memory portion is composed of the resistance variable layer 152, and the lower-layer wire 201 and the upper-layer wire 202 sandwiching the resistance variable layer 152. Each upper-layer wire 202 has a triple-layer structure including the electrically-conductive hydrogen barrier layers 221 and 223 on the side contacting the resistance variable layers 152 and 153, respectively, and the electric conductor layer 222 sandwiched between the layers 221 and 223, as in the lower-layer wires 201.

On the other hand, the upper-layer wires 203 in the third laminated-layer unit are not shared because there is not a fourth laminated-layer unit. The lower-layer wires 202 and the upper-layer wires 203 in the third laminated-layer unit are formed to cross each other, the contact holes are formed in the crossing regions, and each memory portion is composed of the resistance variable layer 153, and the lower-layer wire 202 and the upper-layer wire 203 sandwiching the resistance variable layer 153. Each upper-layer wire 203 has a double-layer structure including the electrically-conductive hydrogen barrier layer 231 and the electric conductor layer 232 having a specific resistance lower than that of the electrically-conductive hydrogen barrier layer 231.

In the second laminated-layer unit and the third laminated-layer unit, the interlayer insulating films 132 and 133 are formed, respectively. Further, in the second laminated-layer unit, in order to connect the upper-layer wires 202 in this laminated-layer unit to the connection wires 41 on the semiconductor substrate 11, the embedded electric conductors 44 are formed in the contact holes and connected to the connection electrodes 43. Whereas the connection wires 41 are made of the same material as the lower-layer wires 171 in the first laminated-layer unit and the connection electrodes 43 are made of the same material as the upper-layer wires 201 in the first laminated-layer unit, it is not necessary to use the same material. The side walls 23 made of an insulating hydrogen barrier material are formed on the inner wall surfaces of the respective contact holes.

In the nonvolatile semiconductor memory apparatuses 60, 70, and 80 thus configured, the laminated-layer units are three-dimensionally stacked to provide larger-capacity memory portions, and fluctuation in characteristics can be significantly suppressed even when the hydrogen gas is generated in the step of forming the laminated-layer units or subsequent steps of forming the interlayer insulating films or the passivation films.

Whereas the case where N=3 is described with reference to FIG. 16, the present invention is not limited to this, and N may be 2, or 4 or larger. Further, also in the nonvolatile semiconductor memory apparatus 55 according to this embodiment and in the nonvolatile semiconductor memory apparatuses 60, 70, and 80 according to the modifications, the interlayer insulating films 131, 132, and 133 may be each made of the insulating hydrogen barrier material, as described in Embodiment 1. Alternatively, only the interlayer insulating film 131 in the first laminated-layer unit, or only the interlayer insulating film 131 in the first laminated-layer unit and the interlayer insulating film 132 in the second laminated-layer unit may be formed of the insulating hydrogen barrier material.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

Since the nonvolatile semiconductor memory apparatus according to the present invention is capable of achieving a higher-speed and higher-density integration, it is useful as a nonvolatile semiconductor memory apparatus or the like to be used in electronic hardware such as personal computers, mobile phones, and the like.

Since the method of manufacturing a nonvolatile semiconductor memory apparatus according to the present invention is capable of achieving a higher-speed and higher-density integration, it is useful as a manufacturing method of a nonvolatile semiconductor memory apparatus or the like to be used in electronic hardware such as personal computers, mobile phones, and the like.

The invention claimed is:

1. A nonvolatile semiconductor memory apparatus comprising:
    a semiconductor substrate;
    a plurality of lower-layer wires formed on the semiconductor substrate to extend in parallel with each other;
    a plurality of upper-layer wires formed above the lower-layer wires to extend in parallel with each other and to cross the lower-layer wires;
    an interlayer insulating film provided between the lower-layer wires and the upper-layer wires; and
    a plurality of resistance variable layers which are embedded in a plurality of contact holes formed in crossing regions where the lower-layer wires and the upper-layer wires cross each other in the interlayer insulating film and are electrically connected to the lower-layer wires and to the upper-layer wires; wherein
    the upper-layer wires electrically connect the plurality of resistance variable layers, and each of the upper-layer wires includes at least two layers which are a lowermost layer made of an electrically conductive material having a hydrogen barrier property and an electric conductor layer having a specific resistance which is lower than a specific resistance of the lowermost layer, and wherein,
    the lowermost layer is provided to completely cover an upper surface of an associated one of the resistance variable layers and to extend to a region surrounding the upper surface.

2. A nonvolatile semiconductor memory apparatus comprising:
    a semiconductor substrate; and
    N-stage (N: integer of 2 or larger) laminated-layer units each including: a plurality of lower-layer wires formed on the semiconductor substrate to extend in parallel with each other; a plurality of upper-layer wires formed above the lower-layer wires to extend in parallel with each other and to cross the lower-layer wires; an interlayer insulating film provided between the lower-layer wires and the upper-layer wires; and a plurality of resistance variable layers which are embedded in a plurality of contact holes formed in crossing regions where the lower-layer wires and the upper-layer wires cross each other in the interlayer insulating film and are electrically connected to the lower-layer wires and to the upper-layer wires; wherein
    the upper-layer wire in the laminated-layer unit in (M−1)-th (M: integer that is not smaller than 2 and not larger than N) stage serves as the lower-layer wire in the laminated-layer unit in M-th stage; wherein the lower-layer wire and the upper-layer wire in each of the laminated-layer units cross each other and the contact hole is provided in a crossing region thereof; and the upper-layer wires electrically connect the plurality of resistance variable layers, and each of the upper-layer wires includes at least two layers which are a lowermost layer made of an electrically conductive material having a hydrogen barrier property and an electric conductor layer having a specific resistance which is lower than a specific resistance of the lowermost layer, and wherein, the lowermost layer is provided to completely cover an upper surface of an associated one of the resistance variable layers and to extend to a region surrounding the upper surface.

3. The nonvolatile semiconductor memory apparatus according to claim 1,
wherein the lowermost layer is provided to cover a side wall surface of the electric conductor layer.

4. The nonvolatile semiconductor memory apparatus according to claim 1,
wherein the lowermost layer includes at least one of Ti—Al—N, Ti—N, Ta—N, Ta—Al—N, and Ta—Si—N.

5. The nonvolatile semiconductor memory apparatus according to claim 1,
wherein the interlayer insulating film is made of an insulating material having a hydrogen barrier property.

6. The nonvolatile semiconductor memory apparatus according to claim 5,
wherein the insulating material having the hydrogen barrier property includes silicone nitride or silicone oxide nitride.

7. The nonvolatile semiconductor memory apparatus according to claim 1,
wherein a side wall made of an insulating material having a hydrogen barrier property is provided on an inner wall surface of the contact hole, and the resistance variable layer is embedded in an inner space of the contact hole which is defined by the side wall.

8. The nonvolatile semiconductor memory apparatus according to claim 7,
wherein the side wall is made of an insulating material including silicon nitride or silicon oxide nitride.

9. The nonvolatile semiconductor memory apparatus according to claim 1,
wherein the resistance variable layer is made of a transition metal oxide material.

10. The nonvolatile semiconductor memory apparatus according to claim 1, wherein the lowermost layer is physically in contact with an associated one of the resistance variable layers.

11. The nonvolatile semiconductor memory apparatus according to claim 2,
wherein the lowermost layer is provided to cover a side wall surface of the electric conductor layer.

12. The nonvolatile semiconductor memory apparatus according to claim 2,
wherein the lowermost layer includes at least one of Ti—Al—N, Ti—N, Ta—N, Ta—Al—N, and Ta—Si—N.

13. The nonvolatile semiconductor memory apparatus according to claim 2,
wherein the interlayer insulating film is made of an insulating material having a hydrogen barrier property.

14. The nonvolatile semiconductor memory apparatus according to claim 2,
wherein a side wall made of an insulating material having a hydrogen barrier property is provided on an inner wall surface of the contact hole, and the resistance variable layer is embedded in an inner space of the contact hole which is defined by the side wall.

15. The nonvolatile semiconductor memory apparatus according to claim 2
wherein the resistance variable layer is made of a transition metal oxide material.

* * * * *